United States Patent
Sawamura et al.

(10) Patent No.: US 6,716,529 B2
(45) Date of Patent: Apr. 6, 2004

(54) ADHESIVE SHEET FOR SEMICONDUCTOR CONNECTING SUBSTRATE, ADHESIVE-BACKED TAPE FOR TAB, ADHESIVE-BACKED TAPE FOR WIRE BONDING CONNECTION, SEMICONDUCTOR CONNECTING SUBSTRATE AND SEMICONDUCTOR DEVICE

(75) Inventors: Yasushi Sawamura, Otsu (JP); Shoji Kigoshi, Otsu (JP); Taku Hatano, Kyoto (JP); Yukitsuna Konishi, Otsu (JP); Yoshio Ando, Shiga (JP)

(73) Assignee: Toray Industries, Inc., Tokyo (JP)

( * ) Notice: Subject to any disclaimer, the term of this patent is extended or adjusted under 35 U.S.C. 154(b) by 0 days.

(21) Appl. No.: 09/940,513

(22) Filed: Aug. 29, 2001

(65) Prior Publication Data
US 2002/0025431 A1 Feb. 28, 2002

Related U.S. Application Data

(62) Division of application No. 08/945,221, filed as application No. PCT/JP97/00453 on Feb. 19, 1997, now Pat. No. 6,303,219.

(30) Foreign Application Priority Data

Feb. 19, 1996 (JP) ............................................. 8-30500
Feb. 19, 1996 (JP) ............................................. 8-30501
Feb. 20, 1996 (JP) ............................................. 8-31782

(51) Int. Cl.[7] ............................................. B32B 27/38
(52) U.S. Cl. ...................... 428/413; 428/349; 428/354; 428/355 EP; 428/355 BL
(58) Field of Search ............................... 428/41.7, 343, 428/344, 349, 354, 355 EP, 355 BL, 413

(56) References Cited

U.S. PATENT DOCUMENTS

| | | |
|---|---|---|
| 5,340,851 A | 8/1994 | Shiobara |
| 5,523,137 A | 6/1996 | Sei |
| 5,659,004 A | 8/1997 | Takigawa |
| 5,827,908 A | 10/1998 | Arai |
| 5,863,988 A * | 1/1999 | Hashimoto et al. .......... 525/105 |
| 5,955,566 A * | 9/1999 | Lee et al. .................... 528/310 |

FOREIGN PATENT DOCUMENTS

| | | |
|---|---|---|
| JP | 06279739 A | 10/1994 |
| JP | 06338681 A | 12/1994 |
| JP | 07268066 A | 10/1995 |
| JP | 08264595 A | 10/1996 |

OTHER PUBLICATIONS

JP 08301973, Abstract, Nov. 19, 1996.*
File Registry for 2461–46–3, biphenyl diepoxide.*

* cited by examiner

Primary Examiner—Robert Dawson
Assistant Examiner—Christopher Keehan
(74) Attorney, Agent, or Firm—Birch, Stewart, Kolasch & Birch, LLP

(57) ABSTRACT

An adhesive sheet for a semiconductor connecting substrate consisting of a laminate having an adhesive layer on a substrate, wherein said adhesive layer contains a thermoplastic resin (A) and an epoxy resin (B) and said epoxy resin (B) contains at least one epoxy resin (B) selected from (I) dicyclopentadiene skeleton-containing epoxy resins, (II) terpene skeleton-containing epoxy resins, and (III) biphenyl skeleton-containing epoxy resins, as an essential component; an adhesive-backed tape for TAB consisting of a laminate having an adhesive layer and a protective film layer on a flexible organic insulating film. The adhesive sheet for a semiconductor connecting substrate, the adhesive-backed tape for TAB and the adhesive-backed tape for wire bonding connection of the present invention are excellent in adhesive strength, insulatability, dimensional accuracy, etc., and can improve the reliability of a semiconductor integrated circuit connecting substrate and a semiconductor device respectively for high density packaging.

34 Claims, 13 Drawing Sheets

ADHESIVE SHEET FOR SEMICONDUCTOR CONNECTING SUBSTRATE, ADHESIVE-BACKED TAPE FOR TAB, ADHESIVE-BACKED TAPE FOR WIRE BONDING CONNECTION, SEMICONDUCTOR CONNECTING SUBSTRATE AND SEMICONDUCTOR DEVICE

This application is a divisional of application No. 08/945,221, filed on Dec. 1, 1997 now U.S. Pat. No. 6,303,219 and for which priority is claimed under 35 U.S.C. §120. application Ser. No. 08/945,221 is the national phase of PCT International Application No. PCT/JP97/00453 filed on Feb. 19, 1997 under 35 U.S.C. §371. The entire contents of each of the above-identified applications are hereby incorporated by reference. This application also claims priority of Application No. 8-30500, 8-30501 and 8-31782 filed in Japan on Feb. 19, 1996, Feb. 19, 1996 and in Japan on Feb. 19, 1996, Feb. 19, 1996 and Feb. 20, 1996, respectively under 35 U.S.C. §119.

TECHNICAL FIELD

The present invention relates to an adhesive sheet suitable as an adhesive layer for a semiconductor connecting substrate used for mounting a semiconductor integrated circuit, an adhesive-backed tape used for tape automated bonding (TAB) (hereinafter called "a tape for TAB"), an adhesive-backed tape used for wire bonding connection (hereinafter called "a tape for WB"), and a semiconductor connecting substrate and a semiconductor device using any of the foregoing.

BACKGROUND ARTS

Conventional semiconductor integrated circuit (IC) mounting techniques include the following.

For mounting an IC, a method in which the electrodes of the IC are wire-bonded to metallic lead frames and sealed by a resin is most popularly used. IC packages produced in this manner are usually provided in such forms as the small outline package (SOP) and the quad flat package (QFP). In contrast to these, as smaller-sized and lighter-weight electronic apparatuses, a ball grid array (BGA), in which connection terminals are arranged on the surface of a package, are being used (FIG. 1).

The BGA method is characterized in that solder balls (almost as many as the pins of the corresponding IC) are provided in a grid-like form as external connectors of the IC connecting substrate. For connecting an apparatus onto a printing wire board, the apparatus is placed on the board in such a manner that the solder ball faces conform with the conductor pattern of an already printed solder, and the solder is rendered molten by reflow to achieve the desired connection. The most important feature is that although the conventional QFP, etc. allows only the surrounding edges to be used for arranging connection terminals, BGA allows the surface of the connecting substrate to be used, so that more connection terminals can be arranged in a small space. This size reducing effect is more intensified in the chip scale package (CSP), and it may be called a μ-BGA (micro BGA) in view of its similarity (FIG. 2).

In the BGA method, for the necessity of keeping the solder ball faces flat for better radiation, a method comprising the steps of laminating a material such as a metallic sheet for reinforcement, radiation, electromagnetic shielding, etc., to the wiring board layer for connecting an IC, using an adhesive sheet, and curing by heating is generally adopted for producing a connecting substrate.

A connecting substrate for BGA is described below with reference to FIG. 4. A connecting substrate for BGA consists of at least one wiring board layer (being constituted by an insulator layer 26 and a conductor pattern 27) for connecting an IC, at least one layer 29 without any conductor pattern formed (functioning as a reinforcing sheet, radiation sheet or shielding sheet, etc.), and at least one adhesive layer 28 for laminating them. In FIG. 4, symbol 25 denotes an organic insulation film; 27, an inner lead; and 30, a solder resist.

For the adhesive layer (adhesive sheet) referred to here, a thermoplastic resin or silicone elastomer (Japanese Patent Publication (Kokoku) No. 6-50448), etc. is proposed for obtaining the effect of easing the thermal stress caused by the difference in thermal expansion coefficient of different materials such as the printed wiring board, solder balls, wiring board layer and the layer without any conductor pattern formed, during temperature cycles and reflow.

On the other hand, as the wiring board layer, a glass epoxy laminated sheet (rigid sheet) had been used, but in recent years, the use of a semiconductor connecting substrate in which a conductor pattern for connecting an IC is formed on an organic insulating film of a polyimide, etc. is increasing. A package using such a tape-like connecting substrate (pattern tape) is generally called a TCP (tape carrier package), and the TCP of a BGA method in particular is called a TAB-BGA or T-BGA.

A TCP has an advantage in that low cost packages can be mass-produced by continuously mounting using a long pattern tape. As for the IC connection method, the tape automated bonding (TAB) method in which bump electrodes of an IC are thermally pressure-bonded to the inner leads of a connecting substrate (by gang bonding or single point bonding) is typical, but a method in which the conductor pads of a connecting substrate and the electrodes of an IC are wire-bonded to each other (hereinafter called "WB method") is also used.

As the pattern tape for a TAB method, a tape for TAB is generally used. A tape for TAB has a three-layer structure in which an adhesive layer and a releasable polyester film, etc. used as a protective film layer are laminated onto a flexible organic insulating film such as a polyimide film.

Usually since the adhesive layer is arranged to be more narrow than the organic insulating film, the tape for TAB is generally produced by once producing an adhesive sheet and laminating it onto the organic insulating film.

The tape for TAB thus obtained undergoes (1) perforation to form sprocket and device holes, (2) thermal lamination with a copper foil and heating for curing the adhesive, (3) back treatment of the copper foil for forming inner leads, (4) pattern forming (resist coating, etching, resist removal, removal of copper foil back treating agent), (5) tin or gold plating, etc., to be processed into a connecting substrate (pattern tape). FIG. 3 shows the form of a pattern tape. FIG. 1 is a sectional view showing an embodiment of the TCP type semiconductor device of the present invention. The inner leads 5 of a pattern tape are thermally pressure-bonded to the gold bumps 2 of IC 1 (inner lead bonding), to mount the IC. Then, a sealing resin 10 is applied for sealing, to prepare a semiconductor device. In the case of TAB-BGA, the tape further undergoes a step of laminating a layer functioning as a reinforcing sheet, radiation sheet or shielding sheet, etc. using an adhesive sheet, and a step of installing solder balls.

For the WB method, a tape for WB suitable for wire bonding connection in adhesive properties is used, though the tape form and the production method are the same as those of the tape for TAB.

A tape for WB undergoes (1) perforation of sprocket and device holes, (2) thermal lamination with a copper foil and heating for curing the adhesive, (3) pattern forming (resist coating, etching, resist removal), (4) tin or gold plating, etc., to be processed into a connecting substrate (pattern tape) (FIG. 5). The pattern tape does not have inner leads, and the conductors of the pattern tape and the gold bumps of a semiconductor integrated circuit are wire-bonded to each other. Finally, as in the case of TAB method, a sealing resin is applied for sealing, to obtain a semiconductor device (FIG. 6).

The above TCP type semiconductor device is connected with a circuit board, etc. on which other parts are mounted, through outer leads or solder balls 9, to be mounted on an electronic apparatus.

DISCLOSURE OF THE INVENTION

The adhesive sheet for a semiconductor connecting substrate is required to have the following properties:

(a) High adhesive strength not allowing peeling even at a reflow temperature of 230° C. or higher.

(b) Moderate elastic modulus and moderate coefficient of linear expansion to ease the thermal stress acting on the different materials forming the connecting substrate due to temperature cycles and reflow.

(c) Processability to allow sticking together and low temperature short time thermal cure.

(d) Insulatability in lamination on wiring.

Of the above properties, it has been especially difficult to achieve a balance between adhesive strength on the one hand and moderate elastic modulus and coefficient of linear expansion on the other hand. In the conventional adhesive compositions, if the adhesive strength is attempted to be improved, the elastic modulus at high temperature drops to pose a problem that totally satisfactory properties cannot be obtained.

In general, the adhesive strength of an adhesive can be enhanced by lowering the elastic modulus to increase the breaking energy, but this method presents a problem in that at high temperature and high humidity, the adhesive is softened, to lower the reflow resistance as well as the adhesive strength at high temperature and high humidity. On the other hand, if the crosslinking degree of the adhesive is increased to improve the reflow resistance and the adhesive strength at high temperature and high humidity, the adhesive is likely to cause brittle fracture, and the internal stress due to curing shrinkage increases, to unpreferably lower the adhesive strength on the contrary. Furthermore, the effect for easing the thermal stress caused by temperature difference is also lost.

An object of the present invention is to solve these problems, and to provide a new adhesive sheet for a semiconductor connecting substrate excellent in processability, adhesive strength, insulation reliability and durability, and also to provide a semiconductor connecting substrate and a semiconductor device using it.

On the other hand, the above mentioned tape for TAB has the following problems.

In the case of a TCP using a tape for TAB, since the adhesive layer of the tape for TAB finally remains in the package, it is required to satisfy such properties as insulatability, adhesiveness and dimensional stability. Since electronic apparatuses become smaller in size and higher in packaging density, the pattern pitches (conductor widths and conductor intervals) of semiconductor connecting substrates become very narrow, and so the adhesive is required to be higher in insulation reliability and in the adhesive strength to the copper foil more narrow in conductor width (hereinafter simply called "adhesive strength"). Especially in an acceleration test of insulation reliability, the declining rate of insulation resistance at high temperature and high humidity of 130° C. and 85% RH or with a voltage applied continuously in a high temperature range of 125° C. to 150° C. is now regarded to be highly important However, in the above mentioned insulation reliability and adhesive strength, the conventional tapes for TAB are not satisfactory enough. For example, since the insulation drops fast when a voltage is applied continuously at high temperature and high humidity, the insulation reliability is insufficient. Especially when the calorific value is large in an integrated circuit acting at a high speed, etc., a serious accident can happen. Furthermore, since the adhesive strength is low, it can happen that conductors peel during pattern processing or that the inner leads peculiar to the TAB method are peeled, not allowing production.

Another object of the present invention is to solve these problems, and to provide a new tape for TAB excellent in insulation durability and adhesive strength, and a semiconductor connecting substrate and a semiconductor device using it.

Furthermore, the said tape for WB presents the following problems.

In the case of a TCP using a tape for WB, like the tape for TAB, since the adhesive layer remains in the package, high insulation reliability (at a high temperature and high humidity of 130° C. and 85% RH) and adhesive strength at narrow pitches are also required. Furthermore, in the WB method, it can happen that the heating and ultrasonic wave application at the time of wire bonding soften the adhesive layer, not allowing wire bonding. So, heat resistance at the time of wire bonding (hereinafter called "WB") is required.

However, in the above mentioned insulation reliability, adhesive strength and WB property, the conventional tapes for WB cannot be said to be satisfactory enough. For example, if the adhesive strength to the conductor is enhanced, the insulation with a voltage applied continuously at high temperature and high humidity drops fast, to show insufficient insulation reliability, and the WB property also drops. On the other hand, if the heat resistance is enhanced to improve the insulation reliability and WB property, the adhesive strength drops, causing the conductor to peel during pattern processing and also after completion of WB.

A further other object of the present invention is to solve these problems, and to provide a new tape for WB satisfying all of insulation durability, adhesive strength and WB property, and a semiconductor connecting substrate and a semiconductor device using it.

The above objects can be achieved by the following present invention. The present invention provides the following:

An adhesive sheet for a semiconductor connecting substrate being constituted by a laminate having an adhesive layer on a substrate, comprising said adhesive layer containing a thermoplastic resin (A) and an epoxy resin (B), and said epoxy resin (B) containing at least one epoxy resin (B) selected from (I) dicyclopentadiene skeleton-containing epoxy resins, (II) terpene skeleton-containing epoxy resins, (III) biphenyl skeleton-containing epoxy reins and (IV) naphthalene skeleton-containing epoxy resins, and a semiconductor connecting substrate and a semiconductor device using it.

Furthermore, an adhesive sheet for a semiconductor connecting substrate, which forms an adhesive layer (E) of a semiconductor integrated circuit board having at least one wiring board layer (C) being constituted by an insulator layer and a conductor pattern, at least one layer without any conductor pattern formed (D) and at least one adhesive layer (e), comprising said adhesive sheet has a storage elastic modulus of 0.1 to 10000 MPa and has a coefficient of linear expansion of $0.1 \times 10^{-5} \sim 50 \times 10^{-5\circ}$ $C.^{-1}$ in a temperature range of −50 to 150° C. after having been cured by heating, and a semiconductor connecting substrate and a semiconductor device using it.

Still furthermore, an adhesive-backed tape for TAB being constituted by a laminate having an adhesive layer and a protective film layer on a flexible organic insulating film, comprising said adhesive layer has a softening temperature of 60 to 110° C. after having been cured, and has an insulation resistance dropping time of 50 hours or more after having been allowed to stand in an environment of 130° C. and 85% RH with DC 100 V applied, and a semiconductor connecting substrate and a semiconductor device using it.

Still furthermore, an adhesive-backed tape for wire bonding being constituted by a laminate having an adhesive layer and a protective film layer on a flexible organic insulating film, comprising said adhesive layer has a softening temperature of 120 to 200° C. after having been cured and has a insulation resistance dropping time of 50 hours or more after having been allowed to stand in an environment of 130° C. and 85% RH with DC 100 V applied.

BEST MODE FOR CARRYING OUT THE INVENTION

Figure 1:
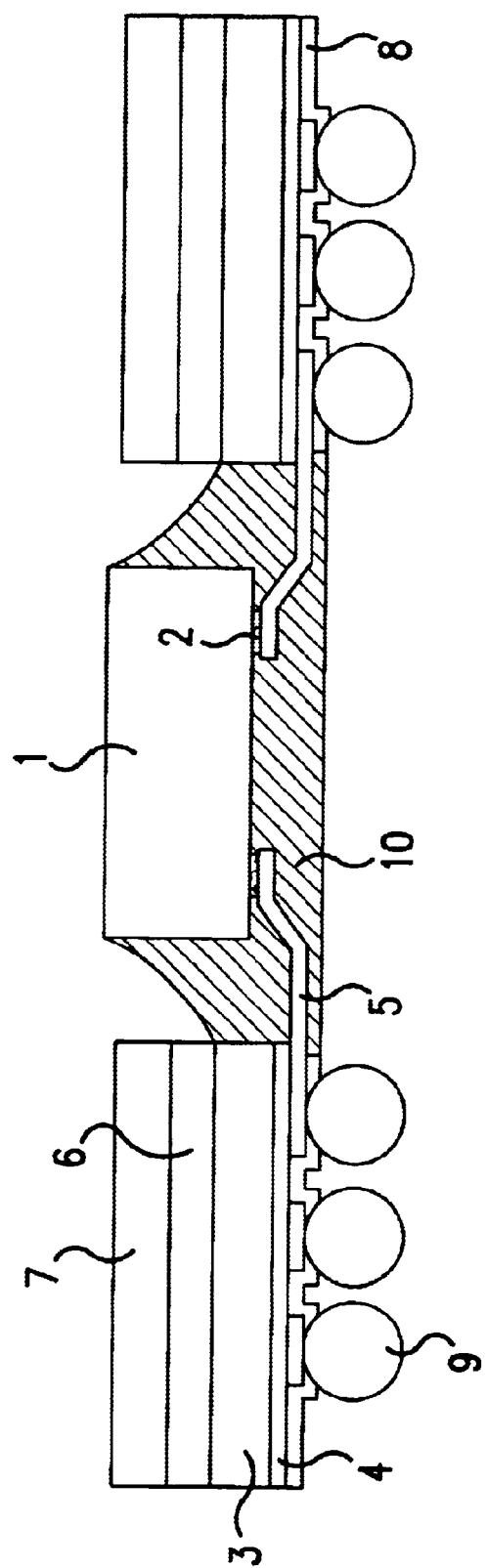
FIG. 1 is a sectional view showing a semiconductor device (TAB-BGA) using the adhesive sheet for a semiconductor connecting substrate of the present invention, as an embodiment.

The semiconductor connecting substrate referred to in the present invention is intended for connecting an IC (bare chip) obtained by forming elements on a semiconductor substrate made of silicone, etc. and cutting and dividing it, and is not especially limited in form, material or production method, as far as it has (C) at least one wiring board layer being constituted by an insulator layer and a conductor pattern, (D) at least one layer without any conductor pattern formed and (E) at least one adhesive layer formed as an adhesive sheet of the present invention. Therefore, the most basic structure is C/E/D, but the semiconductor connecting substrate includes also a multi-layer structure such as C/E/D/E/D.

(C) is a layer with a conductor pattern for connecting the electrode pads of a bare chip with the outside (printed wiring board, etc.) of the package, and is an insulator layer with a conductor pattern formed on either or both sides. As the insulator layer referred to here, a 10 to 125 μm thick flexible insulating film made of a plastic material such as a polyimide, polyester, polyphenylene sulfide, polyether sulfone, polyether ether ketone, aramid, polycarbonate or polyarylate, or of a composite material such as resin impregnated glass cloth, or a ceramic board of alumina, zirconia, soda glass or quartz glass can be suitably used. A laminate being constituted by a plurality of layers made of those selected from the foregoing can also be used. Furthermore, as required, the insulator layer can be treated on the surface by hydrolysis, corona discharge, low temperature plasma, physical surface roughening or adhesive coating, etc. A conductor pattern is generally formed by the subtractive method or additive method, and either method can be used in the present invention. In the subtractive method, a metallic sheet such as a copper foil is bonded onto an insulator layer by an insulating adhesive (the adhesive composition of the present invention can also be used), or a precursor of the insulator layer is laminated on a metallic sheet, being followed by heat treatment, etc. to form the insulator layer. The laminate is etched by chemical treatment, to form the intended pattern. The material in this case can be, for example, a copper clad material for a rigid or flexible printed wiring board, a tape for TAB or a tape for WB.

On the other hand, in the additive method, a conductor pattern is directly formed on an insulator layer by electroless plating, electrolytic plating or sputtering, etc. In any case, the formed conductor can be plated with a highly corrosion resistant metal for prevention of corrosion. The wiring board layer (C) prepared like this can have through holes formed as required, and conductor patterns formed on both sides by plating can be connected with each other by plating.

(D) is a layer substantially independent of (C) and (E) and has a function to reinforce or dimensionally stabilize the semiconductor connecting substrate, or to electromagnetically shield the IC from outside, or to radiate the IC, or to make the semiconductor connecting substrate flame retardant, or to identify the form of the semiconductor connecting substrate, etc. Therefore, its form is not necessarily required to be a layer, and, for example, a three-dimensional form with a structure having plurality of fins for radiation can also be used. Furthermore, as far as any of the above functions is provided, the layer can be either an insulator or conductor, and is not especially limited in material. The materials which can be used for the layer include metals such as copper, iron, aluminum, gold, silver, nickel and titanium, inorganic materials such as alumina, zirconia, soda glass, quartz glass and carbon, and organic materials such as polymers based on a polyimide, polyamide, polyester, vinyl, phenol or epoxy, etc. A composite material obtained by combining them can also be used. For example, a polyimide film thinly plated with a metal, a polymer with carbon kneaded into it render it conductive, and a metallic sheet coated with an organic insulating polymer can be used. Furthermore, as in the case of (C) above, the layer can be variously treated on the surface.

(E) is an adhesive layer mainly used for bonding (C) and (D) together. However, it can also be used for bonding (C) or (D) with another member (e.g., an IC or printed wiring board, etc.) without any limitation. (E) is usually laminated onto a semiconductor connecting substrate in a semi-cured state, and before or after lamination, it can be preliminarily cured by reaction in a temperature range of 30 to 200° C. for a suitable time, to adjust the curing degree.

(E) is formed as the adhesive sheet for a semiconductor connecting substrate (hereinafter called "the adhesive sheet") of the present invention The adhesive sheet is preferably 0.1 to 10000 MPa, more preferably 1 to 5000 MPa in storage elastic modulus and preferably $0.1 \times 10^{-5}$~$50 \times 10^{-5}$° $C.^{-1}$, more preferably $1$~$30 \times 10^{-5}$° $C.^{-1}$ in the coefficient of linear expansion in a temperature range of –50 to 150° C. after having been cured by heating. If the storage elastic modulus is less than 0.1 MPa, the strength of the adhesive is so low that when an apparatus mounted with the IC package is used, the semiconductor connecting substrate is deformed and that when the adhesive sheet is processed, it is unpreferably poor in handling convenience. If more than 10000 MPa, the effect of easing the thermal stress is so low as to unpreferably cause warping of the semiconductor connecting substrate, peeling of the respective layers and cracking of solder balls. If the coefficient of linear expansion is less than $0.1 \times 10^{-5}$° $C.^{-1}$, it is unpreferable because the effect of easing the thermal stress is too small. If it is more than $50 \times 10^{-5}$° $C.^{-1}$, the adhesive itself unpreferably causes thermal stress.

Furthermore, the adhesive sheet is preferably $5 \times 10^5$ $Nm^{-1}$ or more, more preferably $1 \times 10^6$ $Nm^{-1}$ in the breaking energy per unit area at 25° C. after having been cured by heating (hereinafter simply called "the breaking energy"). The breaking energy is considered to have correlation with the adhesive strength in the cohesive breaking mode of the adhesive layer. The breaking energy is obtained from the area below the stress-strain curve obtained by a tensile test. If the breaking energy is lower than $5 \times 10^5$ $Nm^{-1}$, the adhesive strength unpreferably drops.

The thickness of the adhesive layer can be properly selected in relation to the elastic modulus and the coefficient of linear expansion, but is preferably 2 to 500 μm, more preferably 20 to 200 μm.

The adhesive composition used in the adhesive sheet of the present invention preferably contains at least one or more thermoplastic resins and thermosetting resins respectively as essential components, but is not limited in their kinds. A thermoplastic resin functions to enhance adhesiveness and flexibility, to ease thermal stress and to enhance insulatability due to low water absorbability, and a thermosetting resin is necessary to realize the balance of physical properties such as heat resistance, insulatability at high temperature, resistance to chemical and the strength of the adhesive layer.

The thermoplastic resins which can be used here include publicly known resins such as acrylonitrile-butadiene copolymer (NBR), acrylonitrile-butadiene rubber-styrene resin (ABS), styrene-butadiene-ethylene resin (SEBS), acrylic resin, polyvinyl butyral, polyamides, polyesters, polyimides, polyamideimides and polyurethanes. These thermoplastic resins may have functional groups capable of reacting with the thermosetting resins described later. The functional groups are, for example, amino groups, carboxyl groups, epoxy groups, hydroxyl groups, methylol groups, isocyanate groups, vinyl groups, silanol groups, etc. These functional groups intensify the bonding with the thermosetting resin, to improve heat resistance. As the thermoplastic resin, a copolymer with butadiene as an essential comonomer is preferable having regard to the adhesiveness to the materials of (C) and (D), flexibility and the effect of easing thermal stress, and can be selected from various butadiene-containing resins. Especially having regard to the adhesiveness to metals, resistance to chemicals etc., acrylonitrile-butadiene copolymer (NBR) and styrene-butadiene-ethylene resin (SEBS) are preferable. Furthermore, a copolymer with butadiene as an essential comonomer and with carboxyl groups, which can be selected, for example, from NBR (NBR-C), SEBS (SEBS-C), etc. is more preferable. NBR-C can be, for example, a copolymer rubber obtained by copolymerizing acrylonitrile and butadiene at a molar ratio of about 10/90~50/50 and with its terminal groups carboxylated, or a ternary copolymer rubber being constituted by acrylonitrile, butadiene and a carboxyl group-containing polymerizable monomer such as acrylic acid or maleic acid. Examples of them include PNR-1H (produced by Japan Synthetic Rubber Co., Ltd.), "Nipol" 1072J, "Nipol" DN612, "Nipol" DN631 (respectively produced by Nippon Zeon Co., Ltd.). Furthermore, SEBS-C can be Mx-073 (produced by Asahi Chemical Industry Co., Ltd.).

Furthermore, similarly in view of adhesiveness, flexibility and insulatability, a polyamide resin, which can be selected from various polyamide resins is preferable. Especially a resin containing a dicarboxylic acid with 36 carbon atoms (a so-called dimer acid) is suitable since it makes the adhesive layer flexible and is low in the coefficient of water absorption, hence excellent in insulatability. A polyamide resin containing a dimer acid can be obtained by polycondensation of a dimer acid and a diamine according to a conventional method, but in this case, a dicarboxylic acid other than a dimer acid such as adipic acid, azelaic acid or sebacic acid may also be present as a comonomer. The diamines which can be used here include those publicly known such as ethylenediamine, hexamethylenediamine and piperazine, and having regard to moisture absorbability and solubility, a mixture of two or more diamines can also be used. Furthermore, a polymer containing amino groups is excellent in reaction and compatibility with an epoxy resin and further improves insulatability and adhesiveness more. The amount of the amino groups is preferably 1 to 3 in amine value. If the amine value is less than 1, the effect of enhancing insulatability and adhesive strength is too small, and if more than 3, the curing reaction progresses excessively to unpreferably lower processability.

The thermosetting resins which can be used here include those publicly known such as epoxy resins, phenol resins, melamine resin, xylene resin, furan resins and cyanate resins. Especially epoxy resins and phenol resins can be suitably used since they are excellent in insulatability.

The epoxy resin is not especially limited as far as it contains two or more epoxy groups in one molecule, and preferably contains at least one or more dicyclopentadiene skeleton-containing epoxy resins represented by the following general formula (I), terpene skeleton-containing epoxy resins represented by the following general formula (II), biphenyl skeleton-containing epoxy resins represented by the following general formula (III) and naphthalene skeleton-containing epoxy resins represented by the following general formula (IV).

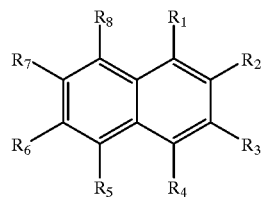

(where two groups of $R_1$ to $R_8$ stand for a 2,3-epoxypropoxy group respectively, and the remaining groups stand for, respectively independently, a hydrogen atom, lower alkyl group with 1 to 4 carbon atoms or halogen atom).

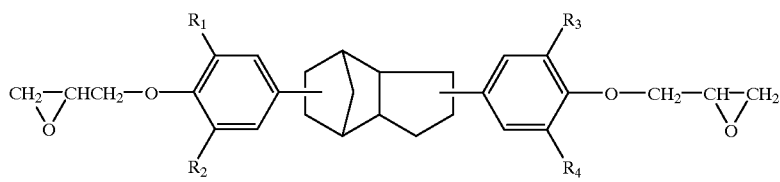

(where $R_1$ to $R_4$ stand for, respectively independently, a hydrogen atom, lower alkyl group with 1 to 4 carbon atoms or halogen atom)

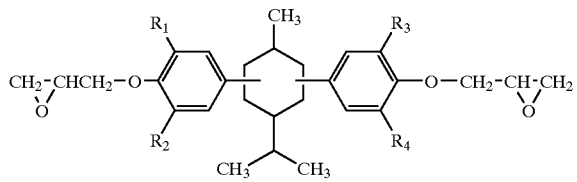

(where $R_1$ to $R_4$ stand for, respectively independently, a hydrogen atom, lower alkyl group with 1 to 4 carbon atoms or halogen atom)

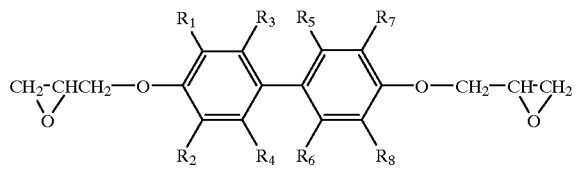

(where $R_1$ to $R_8$ stand for, respectively independently, a hydrogen atom, lower alkyl group with 1 to 4 carbon atoms or halogen atom)

Furthermore, the epoxy resin can also be used together with a glycidyl ether such as bisphenol F, bisphenol A, bisphenol S, resorcinol or trihydroxybenzene, or another epoxy resin, for example, an alicyclic epoxy resin such as epoxydated phenol novolak, epoxydated cresol novolak, epoxydated trisphenylolmethane, epoxydated tetraphenylolethane, epoxydated metaxylenediamine or cyclohexane epoxide, copolymer type brominated epoxy resin of tetrabromobisphenol A and bisphenol A, brominated phenol novolak type epoxy resin, etc.

The phenol resins which can be used include all the publicly known phenol resins such as novolak type phenol resins and resol type phenol resins, for example, resins of phenol, alkyl substituted phenols such as cresol, p-t-butylphenol, nonylphenol and p-phenylphenol, cyclic alkyl modified phenols such as terpene and dicyclopentadiene, resins with functional groups containing a hetero atom such as nitro groups, halogen groups, cyano groups or amino groups, resins with a skeleton of naphthalene or anthracene, etc., resins of a polyfunctional phenol such as bisphenol F, bisphenol A, bisphenol S, resorcinol or pyrogallol.

The amount of the thermosetting resin added is 5 to 400 parts by weight, preferably 50 to 200 parts by weight against 100 parts by weight of the thermoplastic resin. If the amount of the thermosetting resin added is less than 5 parts by weight, it is not preferable because the elastic modulus at high temperature drops so remarkably that the semiconductor integrated circuit connecting substrate is deformed while using the apparatus on which the semiconductor device is mounted, and that the handling convenience during processing is poor. If the amount of the thermosetting resin used exceeds 400 parts by weight, the elastic modulus is so high that the coefficient of linear expansion becomes small, to unpreferably lower the effect of easing the thermal stress.

To the adhesive layer of the present invention, a curing agent and a curing accelerator for epoxy resins and phenol resins can be added without any limitation, which can be selected, for example, from aromatic polyamines such as 3,3',5,5'-tetr amethyl-4,4'-diaminodiphenylmethane, 3,3',5, 5'-tetraethyl-4,4'-diaminodiphenylm ethane, 3,3'-dimethyl- 5,5'-diethyl-4,4'-diaminodiphenylmethane, 3,3'-dichloro-4,4'-diaminodiphenylmethane, 2,2',3,3'-tetrachloro-4,4'-diaminodiphenylmethane, 4,4'-diaminodiphenyl sulfide, 3,3'-diaminobenzophenone, 3,3'-diaminodiphenylsulfone, 4,4'-diaminodiphenylsulfone, 3,4'-diaminodiphenylsulfone, 4,4'-diaminobenzophenone and 3,4,4'-triaminodiphenylsulfone, amine complexes of boron trifluoride such as boron trifluoride triethylamine complex, imidazole derivatives such as 2-alkyl-4-methylimidazoles and 2-phenyl-4-alkylimidazoles, organic acids such as phthalic anhydride and trimellitic anhydride, dicyandiamide, triphenylphosphine, etc. One or more as a mixture of the foregoing can be used. The amount thereof added is preferably 0.1 to 50 parts by weight against 100 parts by weight of the adhesive composition.

In addition to the above ingredients, organic and inorganic ingredients such as an antioxidant and ion arrestor can also be added without any limitation as far as the properties of the adhesive are not impaired. Fine grained inorganic ingredients include metal hydroxides such as aluminum hydroxide, magnesium hydroxide and calcium aluminate hydrate, metal oxides such as silica, alumina, zirconium oxide, zinc oxide, antimony trioxide, antimony pentoxide, magnesium oxide, titanium oxide, iron oxide, cobalt oxide, chromium oxide and talc, inorganic salts such as calcium carbonate, fine metal grains of aluminum, gold, silver, nickel, iron, etc., and carbon black and glass, and organic ingredients include crosslinked polymers such as styrene, NBR rubber, acrylic rubber, polyamides, polyimides and silicone. One or more, as a mixture, of the foregoing can be used. The average grain size of the fine grained ingredients is preferably 0.2 to $5\mu$, considering the dispersion stability. A suitable amount of the ingredients added is 2 to 50 parts by weight against 100 parts by weight of the entire adhesive composition.

If the adhesive layer of the present invention is located as the outermost layer of the semiconductor integrated circuit connecting substrate and is used for bonding another member (e.g., IC or printed wiring board, etc.), a protective film layer may be provided for the adhesive layer. The protective film layer is not especially limited, as far as it can be removed from the adhesive face without impairing the form of the semiconductor integrated circuit connecting substrate before bonding the semiconductor integrated circuit connecting substrate to another member (e.g., IC or printed wiring board, etc.), and can be, for example, a polyester film or polyolefin film coated with silicone or fluorine compound, or paper laminated with any of them, etc.

The semiconductor device referred to in the present invention means a device using the semiconductor connecting substrate of the present invention, and is not especially limited in form or structure. The connection between the semiconductor connecting substrate and an IC can be achieved by any of TAB, WB, resin sealing with flip chips mounted, anisotropically conductive film (adhesive) bonding, etc. A package called a CSP is also included in the semiconductor device of the present invention.

Examples of methods for producing an adhesive sheet for a semiconductor connecting substrate, for producing a semiconductor connecting substrate, and for producing a semiconductor device of the present invention are described below.

Figure 5:
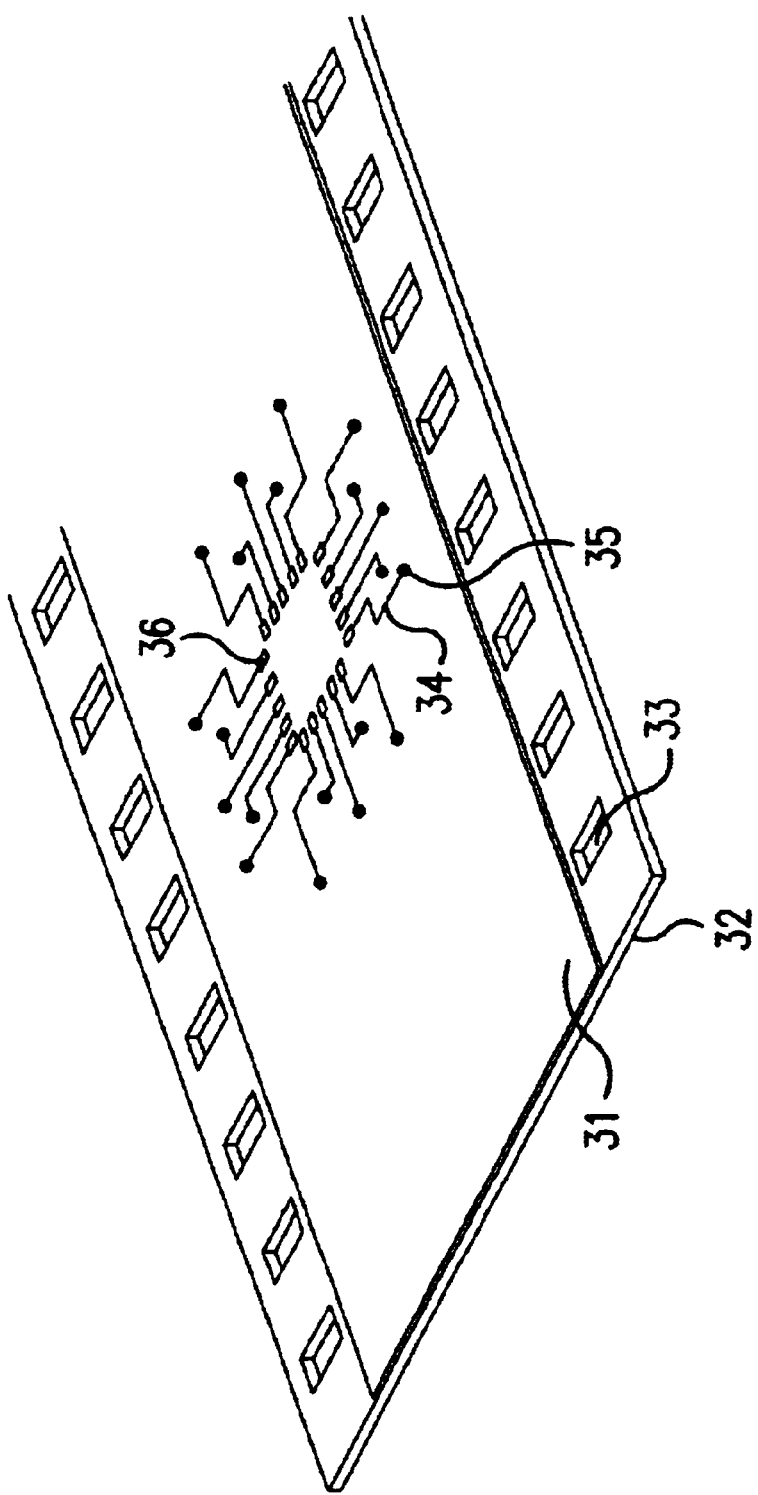
FIG. 5 is a perspective view showing a tape for WB (pattern tape) before mounting with an IC, obtained by processing the adhesive-backed tape for WB of the present invention, as an embodiment.

(1) Preparation of a wiring board layer (C) being constituted by an insulator layer and a conductor pattern: A tape for TAB with a three-layer structure with an adhesive layer and a protective film layer laminated on a polyimide film is prepared by the following steps of (a) to (d): (a) perforation of sprocket and device holes, (b) thermal lamination with a copper foil, (c) pattern forming (resist coating, etching and resist removal), and (d) tin or gold plating. FIG. 5 shows an example of the form of the TAB tape obtained (pattern tape).

(2) Preparation of a layer without any conductor pattern formed (D): A 0.05 to 0.5 mm thick copper sheet or stainless steel (SUS304) sheet is degreased by acetone.

(3) Preparation of an adhesive layer (E): Prepared according to the following steps of (a) to (c). (a) A paint with an adhesive composition dissolved in a solvent is applied onto a releasable polyester film, and dried. It is preferable to form a 10 to 100 $\mu$m thick adhesive layer by the coating. The drying conditions are 100 to 200° C. for 1 to 5 minutes. The solvent is not especially limited, but can be preferably selected from aromatic hydrocarbons such as toluene, xylene and chlorobenzene, ketones such as methyl ethyl ketone and methyl isobutyl ketone, aprotic polar solvents such as dimethylformamide, dimethylacetamide and N-methylpyrrolidone, and their mixtures. (b) A releasable polyester or polyolefin protective film lower than the film of (a) in peeling strength is laminated onto the film of (a), to obtain an adhesive sheet. To increase the thickness of the adhesive, the adhesive sheet can be laminated a plurality of times. After completion of lamination, the adhesive sheet may be heat-treated at about 40 to 70° C. for about 20 to 200 hours, to adjust the curing degree. (c) From the adhesive sheet of (b), the protective film is removed, and the remaining film is laminated on the stainless steel sheet of (D). A suitable lamination temperature is 20 to 200° C., and a suitable pressure is 0.1 to 3 MPa. Furthermore, said paint can be directly applied onto (D) and dried, and subsequently a protective film can be laminated.

Figure 3:
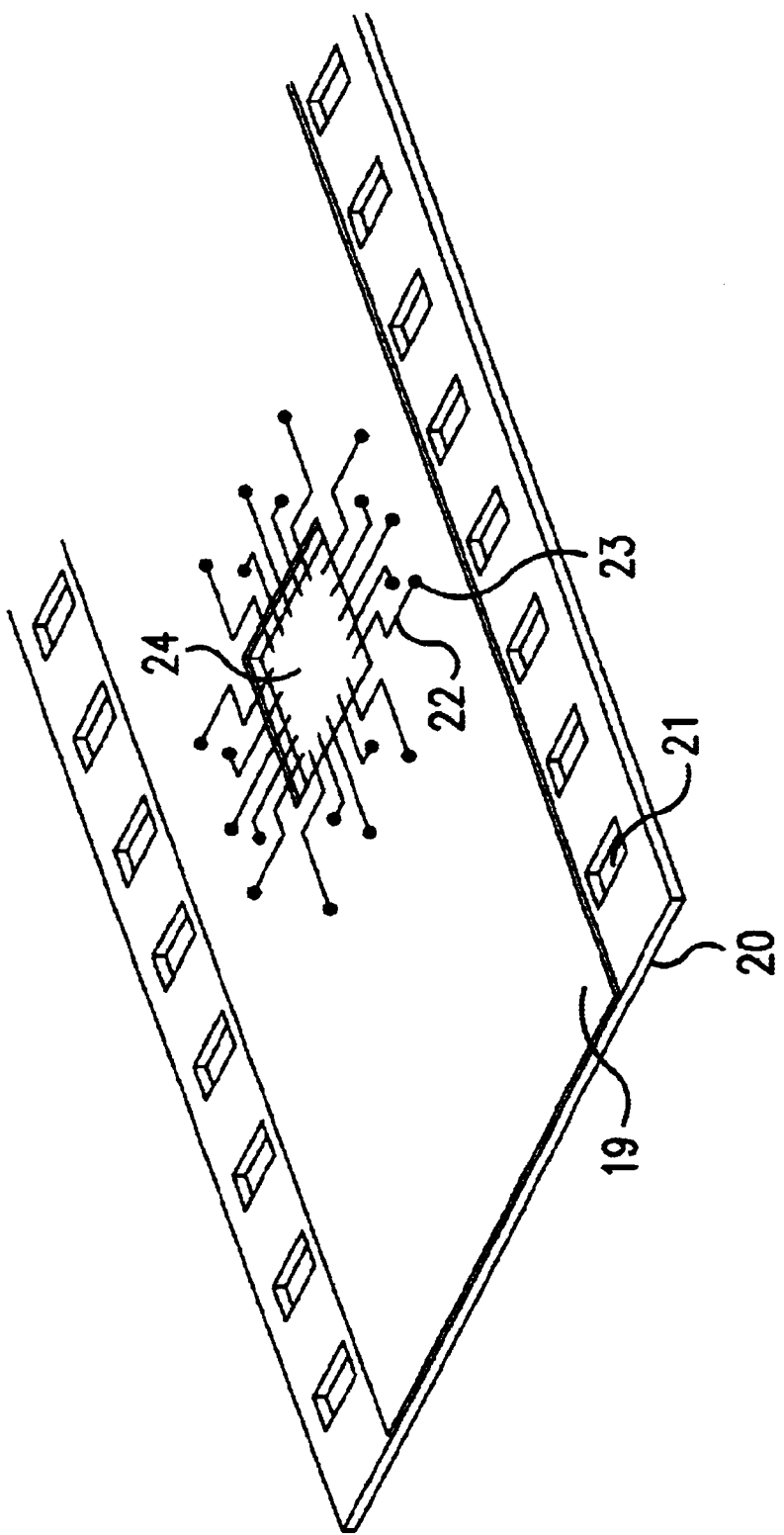
FIG. 3 is a sectional view showing a semiconductor connecting substrate (pattern tape) for BGA before mounting with an IC, obtained by processing the adhesive sheet for a semiconductor connecting substrate of the present invention, as an embodiment.
Figure 4:
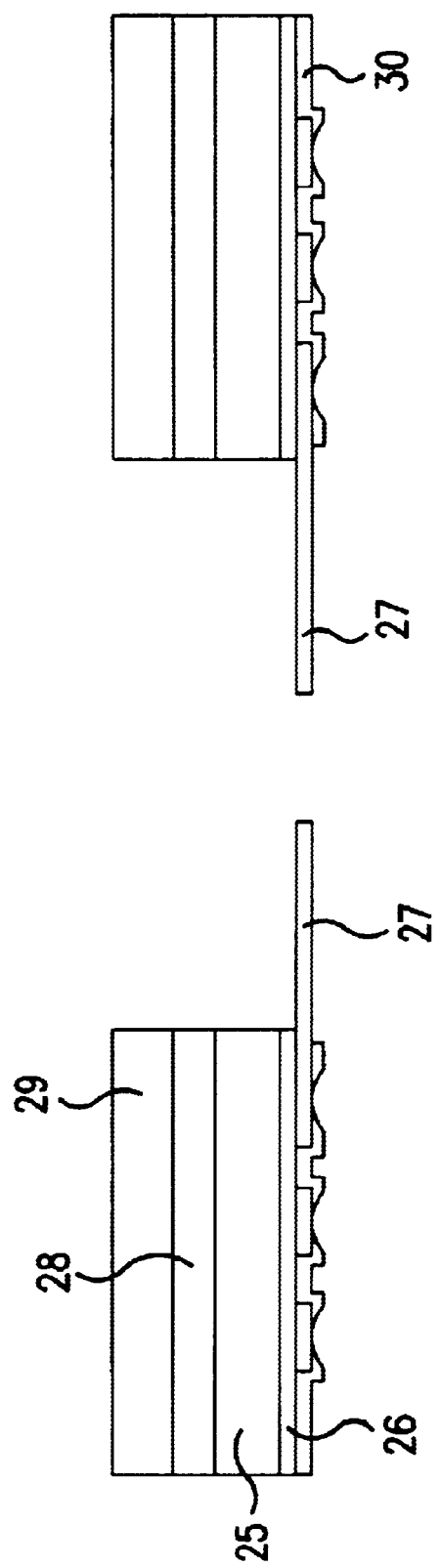
FIG. 4 is a perspective view showing a tape for TAB (pattern tape) before mounting with an IC, obtained by processing the adhesive-backed tape for TAB of the present invention, as an embodiment.

(4) Preparation of a semiconductor connecting substrate: Prepared according to the following steps of (a) to (c). FIG. 3 shows an example of the semiconductor connecting substrate. In FIG. 3, symbol 19 denotes an adhesive layer of a TAB tape; 20, an organic insulating film; 21, a sprocket hole; 22, a conductor pattern; 23, a conductor at a solder ball joint; and 24, a device hole. (a) (D) with an adhesive laminated is punched by a die, and for example, a square die is used to prepare a metallic sheet with an adhesive with a square hole at the center. (b) From the metallic sheet with an adhesive, a polyester base film is removed, and the remaining sheet is laminated onto the pattern tape of (C) on the conductor pattern face or on the polyimide film face of the back side as described in the above (3), with the central hole of the metallic sheet with an adhesive kept consistent with the device hole of (C). (c) The laminate is post-cured at 80 to 200° C. for about 15 to 180 minutes in a hot air oven for curing the adhesive by the heating.

Figure 2:
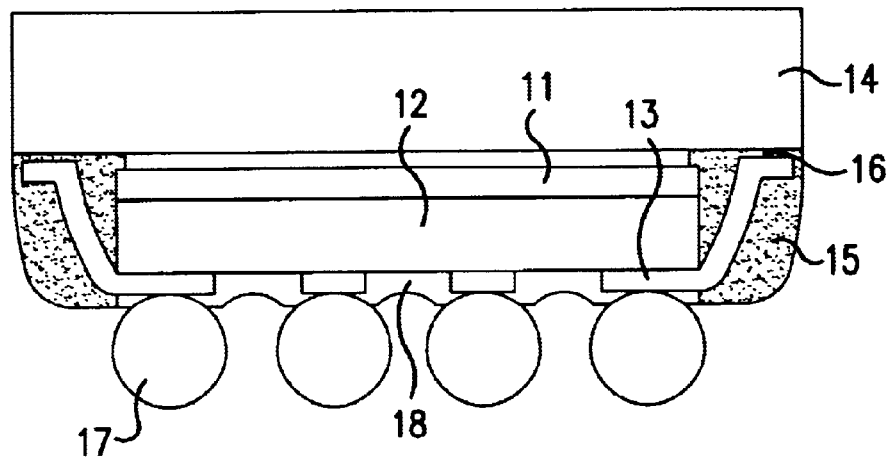
FIG. 2 is a sectional view showing a semiconductor device (CSP) using the adhesive sheet for a semiconductor connecting substrate of the present invention, as an embodiment.

(5) Preparation of a semiconductor device: The inner leads of the semiconductor connecting substrate of (4) are thermally pressure-bonded (inner lead bonding) to the gold bumps of an IC, to mount the IC. Then, a sealing resin is used for sealing, to prepare a semiconductor device. The semiconductor device is connected with a printed circuit board, etc., on which other parts are mounted, through the solder balls, to be mounted on an electronic apparatus. FIGS. 1 and 2 are sectional views showing embodiments of the semiconductor device of the present invention. In FIG. 1, symbol 1 denotes an IC chip; 2, a gold bump; 3, an organic insulating film; 4, an adhesive of a TAB tape; 5, an inner lead; 6, an adhesive layer of a semiconductor connecting substrate; 7, a layer without any conductor pattern formed (reinforcing sheet); 8, a solder resist; 9, a solder ball; and 10, a sealing resin. In FIG. 2, symbol 11 denotes a protective film; 12, an IC chip; 13, an inner lead;, 14, an organic insulating film; 15, a sealing resin; 16, an adhesive layer of a TAB tape; 17, a solder ball; and 18, a solder resist.

The softening temperature in the present invention is defined by the peak temperature of tan δ (tan δ=loss elastic modulus E"/storage elastic modulus E') obtained by dynamic viscoelasticity measurement. Preferable measuring conditions are shown in the evaluation method (4) for the examples. The softening temperature is considered to have correlation with the dimensional accuracy at high temperature, and is preferably 60 to 110° C., more preferably 70 to 90° C. If the softening temperature is lower than 60° C., the adhesive sheet is so soft as to lower the dimensional accuracy such as the position of the conductor, and to unpreferably lower insulatability. If higher than 110° C., the difference from the copper foil or insulating base film in the coefficient of linear expansion cannot be absorbed, and warping is caused, to unpreferably lower the dimensional accuracy.

Furthermore, the adhesive sheet is preferably $5 \times 10^5$ $Nm^{-1}$ or more, more preferably $8 \times 10^5$ $Nm^{-1}$ in the breaking energy at 25° C. after having been cured by heating. If the breaking energy is lower than $5 \times 10^5$ $Nm^{-1}$, the adhesive strength unpreferably drops.

The insulation resistance value and the insulation resistance dropping time refer to those measured under accelerated evaluation conditions, i.e., conditions of evaluation methods (5) and (6) for the examples. The insulation resistance value is preferably $5 \times 10^8$ Ω or more, more preferably $1 \times 10^9$ Ω or more. If the insulation resistance value is lower than $5 \times 10^8$ Ω, the insulation durability of the semiconductor device of the present invention unpreferably drops.

The insulation resistance dropping time is defined as the time taken for the insulation resistance value to drop to a reference value or lower when the above measurement of insulation resistance value is executed continuously. If DC 100 V is applied in an environment of 130° C. and 85% RH, the reference value is $10^7$ Ω, and if DC 100 V is applied in an environment of 150° C., the reference value is $10^9$ Ω.

The insulation resistance dropping time is preferably 50 hours or more, more preferably 100 hours or more, further more preferably 300 hours or more. If the time is shorter than 50 hours, the insulation reliability of the semiconductor device of the present invention unpreferably drops.

It has been generally considered that if the softening temperature or glass transition temperature is lower than the temperature for measuring the insulatability, the insulation resistance value is lower while the insulation resistance dropping time is shorter since the ions in the adhesive migrate remarkably. However, in the adhesive layer of the present invention, though the softening temperature is lower than the temperature for measuring insulatability, the insulation resistance value is high and the insulation resistance dropping time is long as peculiar features. Though the mechanism is unknown, it can be considered that there is a structure to inhibit the migration of ions even though the softening temperature is so low as to make the adhesive layer soft.

The adhesive layer of the tape for TAB of the present invention contains a thermoplastic resin (D) and a thermosetting resin (E). The thermoplastic resin (D) is effective for controlling the softening temperature and functions to improve the adhesive strength and flexibility, to ease the thermal stress and to enhance insulatability due to low water absorbability. The thermosetting resin (E) is necessary to realize the balance of physical properties such as heat resistance, insulatability at high temperature, chemicals resistance and the strength of the adhesive layer.

The amount of the thermoplastic resin added is preferably 30 to 60 wt %, more preferably 35 to 55 wt % based on the weight of the adhesive layer.

The thermoplastic resins which can be used here include those publicly known such as acrylonitrile-butadiene copolymer (NBR), acrylonitrile-butadiene rubber-styrene resin (ABS), styrene-butadiene-ethylene resin (SEBS), acrylic resin, polyvinyl butyral, polyamides, polyesters, polyimides, polyamideimides and polyurethanes. These thermoplastic resins can also have functional groups capable of reacting with the thermosetting resins described later such as phenol resins and epoxy resins. The functional groups can be, for example, amino groups, carboxyl groups, epoxy groups, hydroxyl groups, methylol groups, isocyanate groups, vinyl groups, silanol groups, etc. These functional groups intensify the bonding with the thermosetting resin and preferably improves heat resistance.

As the thermoplastic resin, in view of adhesiveness to the copper foil, flexibility and insulatability, a polyamide resin is preferable, which can be selected from various polyamide resins. A polyamide resin containing a dicarboxylic acid with 36 carbon atoms (a so-called dimer acid) which can make the adhesive layer flexible and is excellent in insulatability due to low coefficient of water absorption is especially suitable. A polyamide resin containing a dimer acid can be obtained by polycondensation of a dimer acid and a diamine by a conventional method. In this case, a dicarboxylic acid other than a dimer acid such as adipic acid, azelaic acid or sebacic acid can also be present as a comonomer. The diamine can be selected from those publicly known such as ethylenediamine, hexamethylenediamine and piperazine, and having regard to moisture absorbability and solubility, a mixture of two or more diamines can also be used.

If a publicly known epoxy resin is added to the adhesive layer of the present invention, the adhesive strength can be preferably improved.

The epoxy resin is not especially limited as far as it has two or more epoxy groups in one molecule, and preferably contains at least one or more dicyclopentadiene skeleton-containing epoxy resins represented by the general formula (I), terpene skeleton-containing epoxy resins represented by the general formula (II), biphenyl skeleton-containing epoxy resins represented by the general formula (III) and naphthalene skeleton-containing epoxy resins represented by the general formula (IV).

Furthermore, the epoxy resin can also be used together with a glycidyl ether such as bisphenol F, bisphenol A, bisphenol S, resorcinol or trihydroxybenzene, or another epoxy resin, for example, an alicyclic epoxy resin such as epoxydated phenol novolak, epoxydated cresol novolak, epoxydated trisphenylolmethane, epoxydated tetraphenylolethane, epoxydated metaxylenediamine or cyclohexane epoxide, a copolymer type brominated epoxy resin of tetrabromobisphenol A and bisphenol A, brominated phenol novolak type epoxy resin, etc.

The amount of the epoxy resin added is preferably 2 to 20 wt %, more preferably 4 to 15 wt % based on the weight of the adhesive layer, and 3 to 70 parts by weight against 100 parts by weight of the thermoplastic resin.

Furthermore, if a phenol resin is added to the adhesive layer, insulation reliability, chemicals resistance and the strength of the adhesive layer can be further improved.

As the phenol resin, any of publicly known phenol resins such as novolak type phenol resins and resol type phenol resins can be used. These include, for example, resins of phenol, alkyl substituted phenols such as cresol, p-t-butylphenol, nonylphenol and p-phenylphenol, of cyclic alkyl modified phenols such as terpene and dicyclopentadiene, resins with functional groups containing a hetero atom such as nitro groups, halogen groups, cyano groups or amino groups, resins with a skeleton of naphthalene or anthracene, etc., resins of a polyfunctional phenol such as bisphenol F, bisphenol A, bisphenol S, resorcinol or pyrogallol, etc. Among them, a resol type phenol resin is suitable since it is effective for improving the insulation resistance dropping time. Especially, if the following compounds (F) and (G) are present as components of the resol type phenol resin, it is preferable because the softening temperature can be lowered very effectively for achieving the balance between adhesive strength and insulatability.

(F) A bifunctional or higher-functional phenol derivative with at least one or more alkyl groups with preferably 5 to 12 carbon atoms, more preferably 7 to 10 carbon atoms.

(G) A trifunctional or higher-functional phenol derivative.

The functionality in this case refers to the sum of the numbers of the regions (ortho and para positions) where methylol groups and phenol nuclei can be bonded to each other when a resol phenol resin is self-crosslinked by addition condensation reaction. For example, orthocresol is bifunctional and metacresol is trifunctional.

(F) is an ingredient to improve the flexibility of the phenol resin, and any mononuclear to undecanuclear phenol derivative with a saturated or unsaturated alkyl group with 5 to 12 carbon atoms can be used. Above all, a saturated alkylphenol is chemically stable preferably, and particularly, octylphenol, nonylphenol and decylphenol are more preferable since they provide a good balance between insulatability and flexibility after curing.

(G) is an ingredient to compensate for the shortage of crosslinking of (F), and is not especially limited as far as it can three-dimensionally crosslink by addition condensation, but considering the compatibility with the ingredient (F) and the solubility into a solvent in processing, phenol, metacresol, bisphenol A or bisphenol F, etc. can be used. In this combination, the phenol derivatives of (F) and (G) can be respectively made into resol resins, to be subsequently mixed, or a mixture of phenol derivatives can be made into a resol resin.

The amount of the phenol resins added is preferably more than 35 to less than 60 wt %, more preferably 40 to 50 wt % based on the weight of the adhesive layer, and 60 to 20 parts by weight against 100 parts by weight of the thermoplastic resin. If the amount is 35 wt % or less, insulatability unpreferably drops, and if 60 wt % or more, the adhesive strength unpreferably drops.

The ratio of the phenol derivatives (F) and (G) is preferably (F)/(G)=0.05 to 6.0, more preferably (F)/(G)=0.2 to 4.0 by weight.

Adding a curing agent and a curing accelerator of the epoxy resin and the phenol resin to the adhesive layer of the present invention is not limited at all. Those publicly known can be used, for example, aromatic polyamines, amine complexes of boron trifluoride such as boron trifluoride triethylamine complex, imidazole derivatives such as 2-alkyl-4-methylimidazoles and 2-phenyl-4-alkylimidazoles, organic acids such as phthalic anhydride and trimellitic anhydride, dicyandiamide, triphenylphosphine, diazabicycloundecene, etc. The amount thereof added is preferably 0.1 to 10 parts by weight against 100 parts by weight of the adhesive layer.

In addition to the above ingredients, organic and inorganic ingredients such as a phenol based or amine based antioxidant and an ion absorbent such as hydrotalcite can be added without any limitation as far as the properties of the adhesive are not impaired.

The flexible insulating film in the present invention refers to a 25 to 125$\mu$ thick film made of a plastic material such as a polyimide, polyester, polyphenylene sulfide, polyether sulfone, polyether ether ketone, aramid, polycarbonate or polyarylate, or of a composite material such as epoxy resin impregnated glass cloth. A laminate constituted by a plurality of films selected from the foregoing can also be used. Furthermore, as required, the film can be treated on either side or both sides by hydrolysis, corona discharge, low temperature plasma, physical surface roughening or adhesive coating, etc.

The protective film layer in the present invention is not especially limited as far as it can be removed from the adhesive face without impairing the form of the tape with the adhesive for connecting a semiconductor before thermally laminating the copper foil, and can be, for example, a polyester film or polyolefin film coated with silicone or fluorine compound, or paper laminated with any of them.

The method for producing a tape for TAB is described below.

A flexible insulating film of a polyimide, etc. is coated with a paint with said adhesive composition dissolved in a solvent, and dried. It is preferable to achieve an adhesive layer thickness of 5 to 25$\mu$ by the coating. The drying conditions are 100 to 200° C. for 1 to 5 minutes. The solvent is not especially limited, but can be preferably a mixture constituted by an aromatic hydrocarbon such as toluene, xylene or chlorobenzene and an alcohol such as methanol, ethanol or propanol. To the film obtained in this manner, a protective film is laminated, and the laminate is finally slit to have a width of about 35 to 158 mm. Alternatively, the protective film can be coated with said adhesive composition and dried, and the coated film can be slit to have a desired width and subsequently have an insulating film laminated on it. The latter method is suitable when the adhesive layer and the insulating film are different in width.

The adhesive layer used in the tape for WB of the present invention is usually provided as uncured, and it must be able to be cured and crosslinked by heating after lamination with a copper foil, has a softening temperature of 120 to 200° C., a storage elastic modulus E' of 20 to 100 MPa at 150° C., and has an insulation resistance dropping time of 50 hours or more after having been allowed to stand in an environment of 130° C. and 85% RH with DC 100 V applied, but is not limited in other properties or chemical structure.

The softening temperature of the adhesive layer after curing referred to here is obtained by dynamic viscoelasticity measurement, and is defined by the peak temperature of tan $\delta$ (tan $\delta$=loss elastic modulus E"/storage elastic modulus E'). Preferable measuring conditions are shown in the evaluation method (4) for the examples.

The softening temperature and the storage elastic modulus at 150° C. are considered to have correlation with the WB property. The softening point is preferably 120 to 200° C., more preferably 140 to 170° C. Furthermore, the storage elastic modulus at 150° C. is preferably 20 to 100 MPa, more preferably 30 to 80 MPa. If the softening point is lower than 120° C. or if the storage elastic modulus is lower than 20 MPa, it is not preferable because the adhesive layer may be too soft at the time of WB, not allowing wire bonding. If the softening point is higher than 200° C. or if the storage elastic modulus is more than 100 MPa, the adhesive strength to the copper foil and flexibility unpreferably drop.

The insulation resistance value and the insulation resistance dropping time refer to those measured under accelerated evaluation conditions, i.e., conditions of evaluation methods (5) and (6) for the examples. The insulation resistance value is preferably $5 \times 10^8$ $\Omega$ or more, more preferably $1 \times 10^9$ $\Omega$ or more. If the insulation resistance value is lower than $5 \times 10^8$ $\Omega$, the insulation durability of the semiconductor device of the present invention unpreferably drops.

The insulation resistance dropping time is defined as the time taken for the insulation resistance value to drop to a reference value or lower when the above measurement of insulation resistance value is executed continuously. If DC 100 V is applied in an environment of 130° C. and 85% RH, the reference value is $10^7$ $\Omega$, and if DC 100 V is applied in an environment of 150° C., the reference value is $10^9$ $\Omega$.

The insulation resistance dropping time is preferably 50 hours or more, more preferably 100 hours or more, still more preferably 300 hours or more. If the time is shorter than 50 hours, the insulation reliability of the semiconductor device of the present invention unpreferably drops.

Conventionally, the WB property has been improved by raising the softening temperature or glass transition temperature and increasing the storage elastic modulus, and it has been general practice to use a thermoplastic resin high in crosslinking density. However, in this case, hard and fragile properties are caused at room temperature, and a drop of adhesive strength to the copper foil and the drop of flexibility occur. To improve this disadvantage, mixing a thermoplastic resin has been examined, but the WB property is in contradictory relation with the adhesiveness and flexibility. The reason is considered to be that the compatibility between the thermosetting resin and the thermoplastic resin is not appropriate. The compatibility is a factor deciding the microphase separated structure of the cured adhesive, and it is known that the viscoelasticity depends on the microphase separated structure. Therefore, it is considered that in the tape for WB of the present invention, mixing the thermoplastic resin and the thermosetting resin of the adhesive layer under control of their compatibility is considered to optimize the microphase separated structure of the cured adhesive and realizes the balance between the WB property and the adhesiveness and flexibility.

The adhesive layer of the tape for WB of the present invention preferably contains a thermoplastic resin (D) and a thermosetting resin (E). The thermoplastic resin (D) is effective for controlling the softening temperature and the storage elastic modulus, and functions to improve the adhesiveness and flexibility, to ease the thermal stress and to enhance insulatability due to low water absorbability. The thermoplastic resin (e) is necessary to realize the balance of physical properties such as heat resistance, insulatability at high temperature, resistance to chemicals and the strength of the adhesive layer.

The amount of the thermoplastic resin (D) added is preferably 30 to 60 wt %, more preferably 35 to 55 wt % based on the weight of the adhesive layer.

The thermoplastic resins which can be used here include those publicly known such as acrylonitrile-butadiene copolymer (NBR), acrylonitrile-butadiene rubber-styrene resin (ABS), styrene-butadiene-ethylene resin (SEBS), acrylic resin, polyvinyl butyral, polyamides, polyesters, polyimides, polyamideimides and polyurethanes. Furthermore, these thermoplastic resins can have functional groups capable of reacting with the thermosetting resins described later such as phenol resins and epoxy resins, for example, amino groups, carboxyl groups, epoxy groups, hydroxyl groups, methylol groups, isocyanate groups, vinyl groups, silanol groups, etc. These functional groups intensify the bonding with the thermosetting resin, to preferably improve the heat resistance.

As the thermoplastic resin, in view of the adhesiveness to the copper foil, flexibility and insulatability, a polyamide resin can be preferably used, which can be selected from various polyamide resins. A resin containing a dicarboxylic acid with 36 carbon atoms (a so-called dimer acid) is especially suitable since it makes the adhesive layer flexible and is low in coefficient of water absorption, hence excellent in insulatability. A polyamide resin containing a dimer acid can be obtained by polycondensation of a dimer acid and a diamine according to a conventional method, but in this case, a dicarboxylic acid other than a dimer acid such as adipic acid, azelaic acid or sebacic acid may also be present as a comonomer. The diamines which can be used here include those publicly known such as ethylenediamine, hexamethylenediamine and piperazine, and having regard to moisture absorbability and solubility, a mixture of two or more diamines can also be used.

If a publicly known epoxy resin is added as the thermoplastic resin, the adhesive strength can be improved.

The epoxy resin is not especially limited, as far as it contains two or more epoxy groups in one molecule, but its compatibility with the thermoplastic resin is important. So, it is preferable to select an epoxy resin with proper compatibility. The compatibility in this case is defined by the haze of the film prepared by mixing the thermoplastic resin and the epoxy resin at a ratio by weight of 1/1. A specific measuring method is shown in the evaluation method (17) for the examples. The haze is preferably 8 to 45, more preferably 10 to 35. If the haze is less than 8, the compatibility is too good, and it is unpreferable because only average properties as a simple mixture can be obtained. If more than 45, the mixture is too heterogeneous, and the properties of either ingredient are unpreferably manifested too strongly.

The epoxy resins which can be used here include, for example, cyclopentadiene skeleton-containing epoxy resins, terpene skeleton-containing epoxy resins, biphenyl skeleton-containing epoxy resins, resorcinol diglycidyl ether, phthalic acid diglycidyl ester, ethylene oxide modified bisphenol A diglycidyl ether (e.g., BEO-60E produced by New Japan Chemical Co., Ltd.), etc. Above all, the dicyclopentadiene skeleton-containing epoxy resins represented by the general formula (I), terpene skeleton-containing epoxy resins represented by the general formula (II) and biphenyl skeleton-containing epoxy resins represented by the general formula (III) are especially preferably since they are good in heat resistance.

The epoxy resin can also be used together with a glycidyl ether such as bisphenol F, bisphenol A, bisphenol S, trihydroxybenzene or dihydroxynaphthalene, or another epoxy resin, for example, alicyclic epoxy resin such as epoxydated phenol novolak, epoxydated cresol novolak, epoxydated trisphenylolmethane, epoxydated tetraphenylolethane, epoxydated metaxylenediamine or cyclohexane epoxide, copolymer type brominated epoxy resin of tetrabromobisphenol A and bisphenol A, brominated phenol novolak type epoxy resin, etc.

The amount of the epoxy resin added is preferably 10 to 40%, more preferably 15 to 30 wt % based on the weight of the adhesive layer, and 15 to 140 parts by weight against 100 parts by weight of the thermoplastic resin. If the amount is less than 10 wt %, the softening point drops, to lower the WB property, and also to lower the adhesive strength. If more than 40 wt %, insulatability unpreferably drops.

In the present invention if a phenol resin is added to the adhesive layer, insulation reliability, resistance to chemicals and the strength of the adhesive layer can be further improved.

Furthermore, if a publicly known phenol resin is added as the thermoplastic resin, insulatability, chemicals resistance and the strength of the adhesive layer can be further improved.

The phenol resins which can be used here include those publicly known such as novolak type phenol resins and resol type phenol resins, for example, resins of phenol, alkyl substituted phenols such as cresol, p-t-butylphenol, nonylphenol and p-phenylphenol, and of cyclic alkyl modified phenols such as terpene and dicyclopentadiene, resins with functional groups containing a hetero atom such as nitro groups, halogen groups, cyano groups and amino groups, resins with a skeleton of naphthalene, anthracene, etc., and resins of polyfunctional phenols such as bisphenol F, bisphenol A, bisphenol S, resorcinol and pyrogallol. Among them, a resol type phenol resin is more suitable since it is effective in improving the insulation resistance dropping time.

The amount of the phenol resin added is preferably more than 35 to less than 60 wt %, more preferably 40 to 50 wt % based on the weight of the adhesive layer, and 60 to 200 parts by weight against 100 parts by weight of the thermoplastic resin. If the amount is 35 wt % or less, the insulatability unpreferably drops, and if 60 wt % or more, the adhesive strength unpreferably drops.

To the adhesive layer of the present invention, a curing agent and a curing accelerator of epoxy resins and phenol resins can be added without any limitation, which can be selected from those publicly known, for example, aromatic polyamines, amine complexes of boron trifluoride such as boron trifluoride triethylamine, imidazole derivatives such as 2-alkyl-4-methylimidazoles and 2-phenyl-4-alkylimidazoles, organic acids such as phthalic anhydride and trimellitic anhydride, dicyandiamide, triphenylphosphine, diazabicycloundecene, etc. The amount thereof added is preferably 0.1 to 10 parts by weight against 100 parts by weight of the adhesive layer.

In addition to the above ingredients, organic and inorganic ingredients such as a phenol based or amine based antioxidant and ion absorbent such as hydrotalcite can be added without any limitation as far as the properties of the adhesive are not impaired.

The flexible insulating film in the present invention refers to a 25 to 125$\mu$ film made of a plastic material such as a polyimide, polyester, polyphenylene sulfide, polyether sulfone, polyether ether ketone, aramid, polycarbonate or polyarylate, or of a composite material such as epoxy resin impregnated glass cloth. A laminate constituted by a plurality of films selected from the foregoing can also be used. Furthermore, as required, the film can be treated on either side or both sides by hydrolysis, corona discharge, low temperature plasma, physical surface roughening or adhesive coating, etc.

The protective film layer in the present invention is not especially limited as far as it can be removed from the adhesive face without impairing the form of the tape with the adhesive for connecting a semiconductor before thermally laminating the copper foil, and can be, for example, a polyester film or polyolefin film coated with silicone or fluorine compound, or paper laminated with any of them.

The method for producing a tape for WB is described below.

A flexible insulating film of a polyimide, etc. is coated with a paint in which said adhesive composition is dissolved in a solvent, and dried. It is preferable to achieve an adhesive layer thickness of 5 to 25$\mu$ by the coating. The drying conditions are 100 to 200° C. for 1 to 5 minutes. The solvent is not especially limited, but can be preferably a mixture constituted by an aromatic hydrocarbon such as toluene, xylene or chlorobenzene and an alcohol such as methanol, ethanol or propanol. To the film obtained in this manner, a protective film is laminated, and the laminate is finally slit to have a width of about 35 to 158 mm. As another method, the protective film can be coated with said adhesive composition and dried, and the coated composition can be slit to have a desired width and subsequently have an insulating film laminated on it. The latter method is suitable when the adhesive layer and the insulating film are different in width.

The present invention is described below with reference to examples, but is not limited thereto or thereby. Before describing examples, evaluation methods are described below.

Evaluation Methods (1) Preparation of a Wiring Board Layer (C) of a Semiconductor Connecting Substrate (Pattern Tape for Evaluation)

On an adhesive-backed tape for TAB (31N0-00ES produced by Toray Industries, Inc.), a 18 $\mu$m thick electrolytic copper foil (3EC-VLP produced by Mitsui Mining & Smelting Co., Ltd.) was laminated at 140° C. and 0.1 MPa. In succession, the laminate was heated to be cured in an air oven at 80° C. for 3 hours, at 100° C. for 5 hours and at 150° C. for 5 hours, to prepare a tape with a copper foil for TAB. On the copper foil face of the obtained tape with the copper foil for TAB, a photoresist layer was formed, being followed by etching and resist removal according to a conventional method, to prepare a pattern tape for evaluation.

(2) Preparation of a Layer (C), Without any Conductor Pattern Formed, of a Semiconductor Connecting Substrate (Reinforcing and Radiation Sheet)

On a 0.1 mm thick pure copper sheet, a 100 $\mu$m thick adhesive sheet was laminated at 140° C. and 0.1 MPa, and formed into a 30 mm square.

(3) Evaluation of Conductor Pattern Embeddability and Cure Foaming

On the conductor pattern face of the pattern tape for evaluation of (1), the pure copper sheet with an adhesive of (2) was laminated at 130° C. and 0.1 MPa, and the laminate was heated to be cured in an air oven at 150° C. for 2 hours. It was immersed in an etchant mainly composed of ferric chloride, to dissolve said pure copper sheet. Finally the exposed adhesive layer was observed by a stereoscopic microscope of 30 times in magnification, to evaluate the foaming at the time of curing and the embeddability of the conductor pattern.

(4) Evaluation of Adhesive Strength

The pure copper sheet with an adhesive layer as described in (2) was laminated on a polyimide film ("Upilex" 75S produced by Ube Industries, Ltd.) at 130° C. and 0.1 MPa, and the laminate was heat to be cured in an air oven at 150° C. for 2 hours. The polyimide film obtained as a sample was cut to have a width of 2 mm, and peeled at a speed of 50 mm/min at a 90° direction by a tensile tester (Model UCT-100 produced by K. K. Orientec), and the peeling force was measured.

(5) Insulation Reliability

On the conductor pattern face of the pattern tape for evaluation of (1) of 100 $\mu$m in conductor width and 100 $\mu$m in inter-conductor distance as a comb-shaped sample for evaluation, the pure copper sheet with an adhesive layer as described in (2) was laminated at 130° C. and 0.1 MPa, and the laminate was heated to be cured in an air oven at 150°

C. for 2 hours. The obtained sample was placed in a thermo-hygrostat (Model IE-21 produced by Yamato Scientific Co. Ltd.) of 85° C. and 85% RH, and with a voltage of 100 V applied continuously, the resistance value was measured immediately and 200 hours later by a super insulation tester (Model DSM-8101 produced by Toa Electronics Co. Ltd.).

(6) Solder Heat Resistance

A 30 mm square sample prepared as described in (4) was conditioned in an atmosphere of 85° C. and 85% RH for 48 hours, and immediately floated on a solder bath for 60 seconds, to measure the maximum temperature at which neither swelling nor peeling occurred.

(7) Heat Cycle Test

A 30 mm square sample prepared as described in (4) was placed in a heat cycle tester (Model PL-3 produced by Tabai Espec Corp.) to be treated for 600 cycles of maintenance at a minimum temperature of −20° C. and a maximum temperature of 100° C. for 1 hour each, to evaluate peeling.

(8) Measurement of Storage Elastic Modulus

An adhesive layer was laminated, to make a total thickness of about 500 $\mu$m, and the laminate was post-cured at 150° C. for 2 hours, to prepare a sample. It was measured using a dynamic viscoelasticity measuring instrument (RHEOVIBRON-DDV-II/III-EA produced by K. K. Orientec) in the tensile mode at a frequency of 35 Hz and a heating rate of 2° C. min$^{-1}$.

(9) Measurement of Coefficient of Linear Expansion

Three sheets of an about 500 $\mu$m sample similar to that of (8) were laminated The laminate was heated at 2° C. min$^{-1}$ in the compression mode using a micro constant load thermal dilatometer (produced by Rigaku Denki K.K.), and the coefficient of linear expansion was obtained from the coefficient of linear thermal expansion at a reference temperature of 25° C.

(10) Measurement of Breaking Energy

An about 100 $\mu$m thick sample prepared as described in (8) and post-cured at 150° C. for 2 hours was tested by a tensile tester (Model UCT-100 produced by K. K. Orientec) at a tensile speed of 50 mm/min, to record the stress-strain curve until breakage occurred. From the area below the curve, the breaking energy was obtained.

(11) Method for Preparing a Tape Sample for TAB and a Tape Sample For WB

An adhesive-backed tape for TAB and a tape for WB of the present invention were used, to prepare pattern tapes for evaluation respectively as described in (1).

(12) Plating

Figure 7:
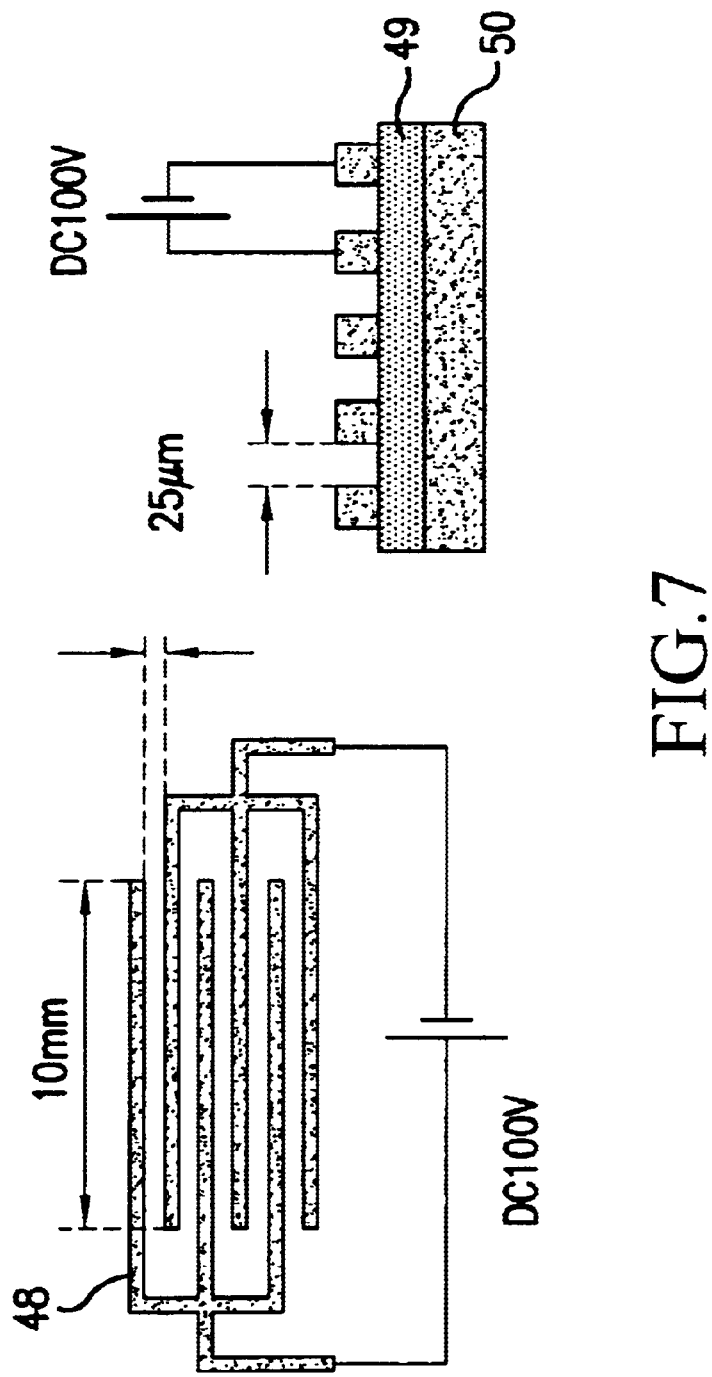
FIG. 7 is a drawing showing a comb shaped sample for measuring the insulation resistance.

The sample obtained in (11) was immersed in a borofluoric acid based electroless tin plating solution (LT-34 produced by Simplay Far East) at 70° C., to be plated with tin to a thickness of 0.5$\mu$. The sample for adhesive strength measurement was 50 $\mu$m in conductor width. The sample for insulatability measurement was formed as shown in FIG. 7. In FIG. 7, symbol 48 denotes a conductor portion of a pattern for insulation measurement; 49, an adhesive layer of a TAB tape; and 50, an organic insulating film.

A sample for wire bonding property measurement of (16) was obtained by electroplating a 0.1 $\mu$m thick nickel ground with gold to a thickness of 0.5 $\mu$m (Aurobel UP-24 produced by Japan Ronal K.K.).

(13) Evaluation of Copper Foil Adhesive Strengths of a Tape for TAB and a tape for WB A copper foil as a sample of 50 $\mu$m in conductor width obtained as described in (11) and (12) was peeled at a speed of 50 mm/min in a 90° direction using a tensile tester (UTM-11-5HR produced by K. K. Orientec), and the peeling force was measured.

(14) High Temperature High Humidity Insulation Reliability

A comb-shaped sample of 25$\mu$ in conductor width and 25$\mu$ in inter-conductor distance for evaluation shown in FIG. 7 obtained as described in (11) and (12) was placed in a thermo-hygrostat (Model TPC-211D produced Tabai Espec Corp.) at 130° C. and 85% RH with a voltage of DC 100 V applied continuously, and the insulation resistance dropping time to reach a resistance value of $10^7$ Ω or less was measured. The resistance value was measured by a super insulation tester (Model DSM-8101 produced by Toa Electronics Co. Ltd.).

(15) High Temperature Insulation Reliability

A sample for evaluation with the same form as that of (14) was placed in an air oven (Model ID-21 produced by Yamato Scientific Co. Ltd.) at 150° C. with a voltage of DC 100 V applied continuously, and the insulation resistance dropping time to reach a resistance value of $10^9$ Ω or less was measured.

(16) Evaluation of Wire Bonding Property

A tape for WB (gold plated pattern tape) prepared as described in (11) and (12) had gold wires bonded at 180° C. at a load of 60 g and at an ultrasonic frequency of 58 kHz. A tensile strength test was carried out using a tensile strength tester (Model Microtester 22 produced by Dage).

(17) Measurement of Haze

A thermoplastic resin and an epoxy resin were mixed at 1/1 by weight, and the mixture was dissolved into a solvent common to both to achieve a concentration of about 10 wt %. The solution was cast to form a film of about 12 $\mu$m in dry thickness. The sample obtained was used to measure the haze according to JIS K 7105.

(18) Evaluation of Dimensional Accuracy (Warping at the Time of Curing)

A tape sample for TAB with a 12 $\mu$m thick adhesive layer on a 75 $\mu$m thick base polyimide film was cut into a specimen of 35 mm×6 mm, and the cover film was removed. The remaining film was post-cured under the same conditions as described in (1). Since the film curled with the adhesive inside, it was placed on a flat sheet to form an arch, and the maximum height from the flat sheet was measured by a micrometer.

Reference Example 1

Synthesis of Polyamide Resin

A dimer acid (PRIPOL1009 produced by Unichema) as an acid component and hexamethylenediamine (produced by Wako Pure Chemical Industries Ltd.) as an amine component were used with the acid/amine ratio changed in a range from 1.1 to 0.9, to produce an acid/amine reaction product. The acid/amine reaction product, defoaming agent and 1% or less of phosphoric acid catalyst were mixed to prepare a polyamide reaction product. The polyamide reaction product was stirred and heated at 140° C. for 1 hour, and heated to 205° C., being stirred at that temperature for about 1.5 hours. It was held in vacuum of about 15 mm Hg for 0.5 hour, and the temperature was lowered. Finally, an antioxidant was added, and a polyamide resin having an amine value of 2.5 was taken out.

Reference Example 2

Preparation of a Soluble Content of a High Molecular Resol Phenol

A high molecular resol phenol (Bell Pearl S895 produced by Kanebo, Ltd.) was dissolved into chlorobenzene at 60° C. to achieve a concentration of about 10 wt %. The solution was filtered by a 0.5 μm filter, and the soluble content was taken out. From the difference in solid concentration before and after filtration, the obtained soluble content was 96%.

EXAMPLE 1

Figure 8:
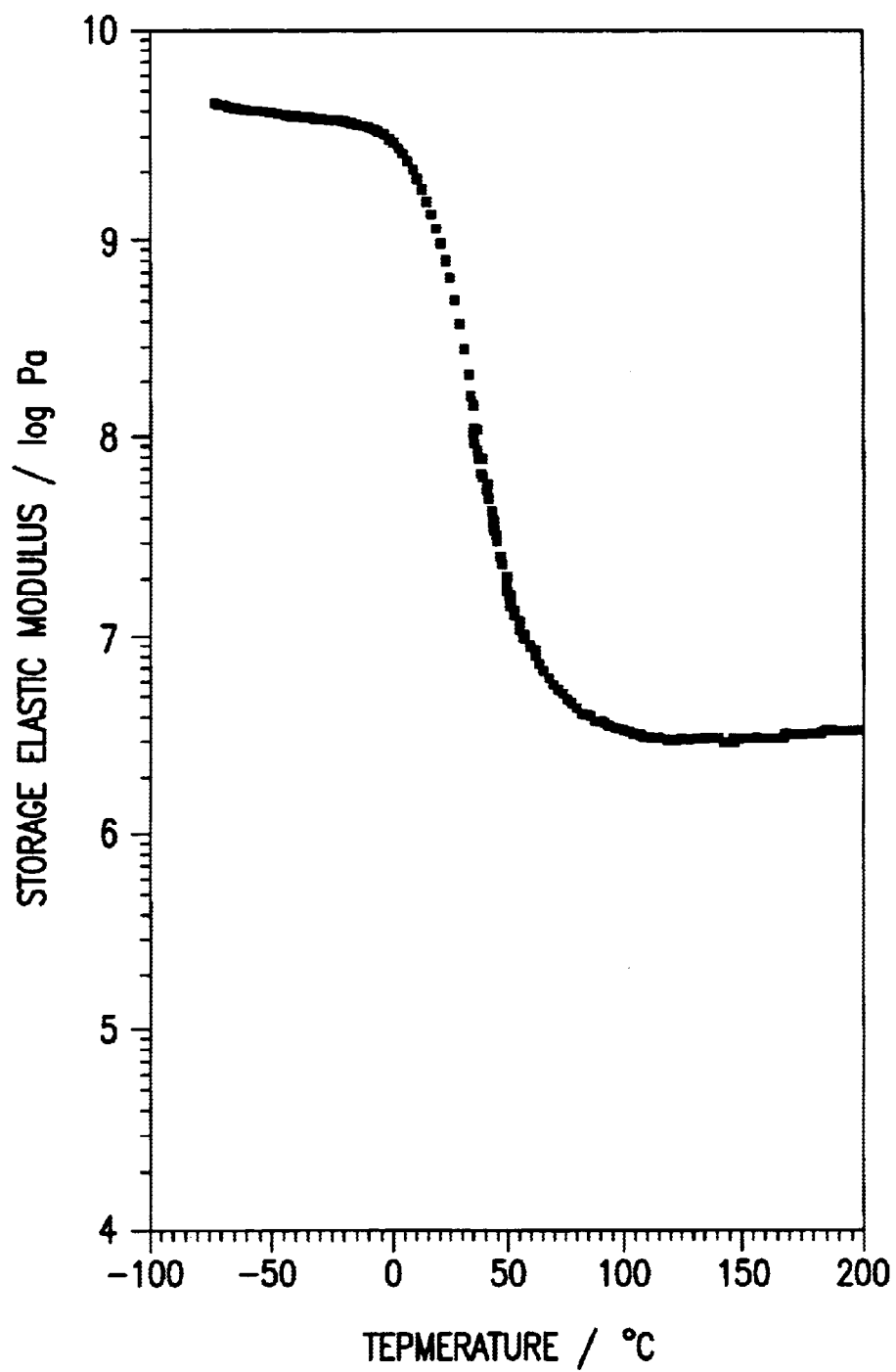
FIG. 8 is a diagram showing the measured results of storage elastic modulus E' of the adhesive layer as the adhesive sheet for a semiconductor connecting substrate of the present invention.
Figure 9:
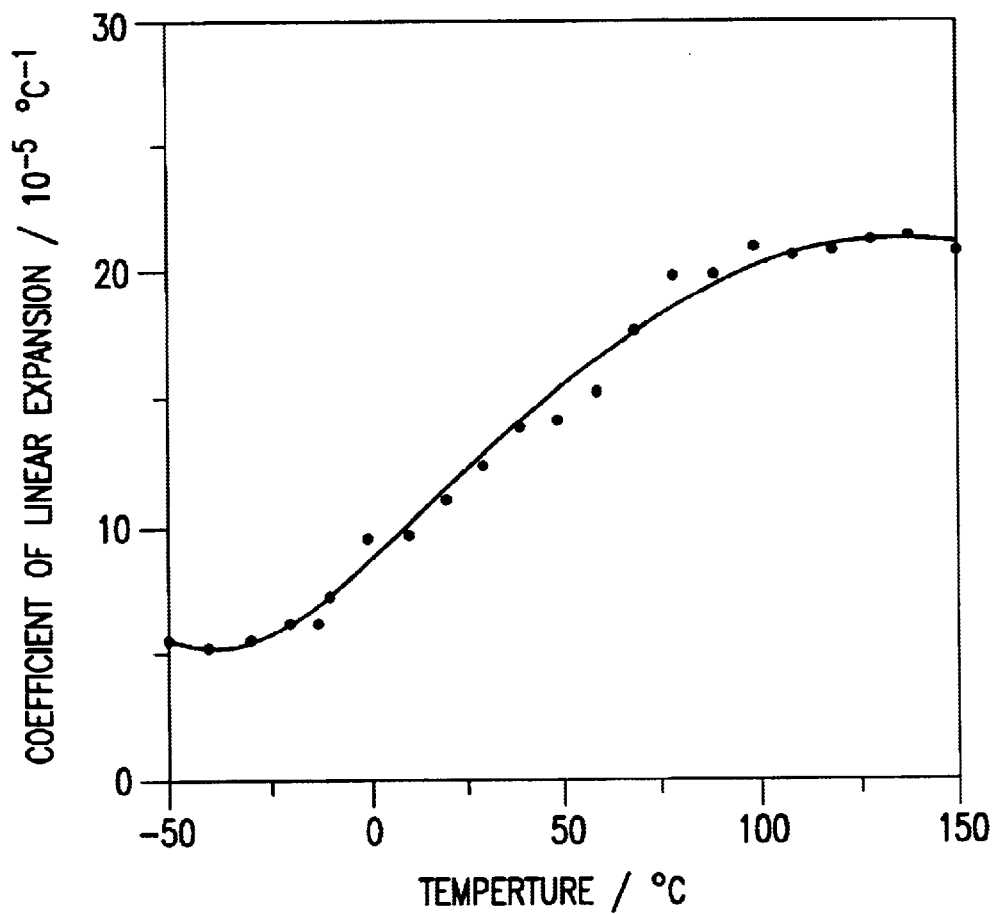
FIG. 9 is a diagram showing the measured results of the coefficient of linear expansion of the adhesive layer as the adhesive sheet for a semiconductor connecting substrate of the present invention.

Aluminum hydroxide (H-42I produced by Showa Denko K.K.) was mixed with toluene, and the mixture was treated by a sand mill, to prepare an aluminum hydroxide dispersion. NBR-C (PNR-1H produced by Japan Synthetic Rubber Co., Ltd.), bisphenol A type epoxy resin ("Epikote" 834 produced by Yuka Shell Epoxy K.K., 250 in epoxy equivalent), brominated epoxy resin ("Epikote" 5050 produced by Yuka Shell Epoxy K.K., 49% in bromine content and '395 in epoxy equivalent), 4,4'-diaminodiphenylsulfone and methyl ethyl ketone equal in weight to the dispersion were added to the dispersion to achieve the composition ratio shown in Table 2, and the mixture was stirred at 30° C., to prepare an adhesive solution. The adhesive solution was applied to a 25μ thick polyethylene terephthalate film with a silicone releasing agent ("Film Bina" GT produced by Fujimori Kogyo Co., Ltd.) by a bar coater to achieve a dry thickness of about 50μ, and dried at 170° C. for 5 minutes. Two sheets of the coated film were laminated with the adhesive faces kept to face each other, to prepare an adhesive sheet of 100μ in adhesive thickness. The adhesive sheet was laminated on a 0.1 mm thick pure copper sheet at 100° C. and 0.1 MPa, to obtain a pure copper sheet with an adhesive layer. The properties are shown in Table 3, and how the storage elastic modulus and the linear expansion coefficient depend on the temperature is shown in FIGS. 8 and 9.

The pure copper sheet with an adhesive layer and with an external form of 30 mm square obtained according to the above procedure was punched to open a 20 mm square hole at the center. On the other hand, as described in said evaluation method (1) a pattern tape shown in FIG. 7 was prepared. However, the conductor pattern face was coated with a photosensitive solder resist ("Probimer" 71 produced by Ciba Geigy), and it was dried, exposed with a photo mask, developed and thermoset. On the pads for solder ball connection, the resist was removed. Then, the pure copper sheet and the pattern tape were thermally pressure-bonded to each other on the side opposite to the conductor pattern at 130° C. and 0.1 MPa, with the hole in the pure copper sheet kept in register with the device hole in the pattern tape, and the laminate was heated to be cured in an air oven at 150° C. for 2 hours, to prepare a semiconductor connecting substrate.

Furthermore, at the inner leads of the semiconductor connecting substrate, a semiconductor integrated circuit was connected by inner lead bonding at 450° C. for 1 minute. Subsequently, an epoxy based liquid sealant ("Chip Coat" 1320-617 produced by Hokuriku Toryo K.K.) was applied for sealing. On the pads for solder ball connection, cream solder was printed, and solder balls (produced by Tanaka Denshi Kogyo K.K.) of 0.3 mm in diameter were arranged. The assembly was heated in a 260° C. reflow furnace, to obtain a semiconductor device FIG. 1 is a sectional view showing the obtained semiconductor device.

EXAMPLE 2

Spherical silica ("Ecserica" produced by Tokuyama Corp.) was mixed with toluene, and the mixture was treated by a sand mill, to prepare a dispersion. NBR-C (PNR-1H produced by Japan Synthetic Rubber Co., Ltd.), SEBS-C (Mx-073 produced by Asahi Chemical Industry Co., Ltd.), naphthalene skeleton-containing epoxy resin ("Epiclon" HP4032 produced by Danippon Ink & Chemicals, Inc., 150 in epoxy equivalent), 4,4'-diaminodiphenylsulfone, and methyl ethyl ketone equal in weight to the dispersion were added to the dispersion to achieve the composition ratio shown in Table 1, and the mixture was stirred at 30° C. to prepare an adhesive solution. The adhesive solution was used to obtain a pure copper sheet with an adhesive layer as described in Example 1. The properties are shown in Table 3.

EXAMPLES 3 to 6

Adhesives prepared by using the raw materials shown in Table 1 at the composition ratios shown in Table 2 as described in Example 1 were used to obtain adhesive sheets for semiconduction connecting substrates. The properties are also shown in Table 3.

Comparative Example 1

Aluminum hydroxide (H-42I produced by Showa Denko K.K.) was mixed with toluene, and the mixture was treated by a sand mill, to prepare an aluminum hydroxide dispersion NBR-C (PNR-1H produced by Japan Synthetic Rubber Co., Ltd.) and methyl ethyl ketone equal in weight to the dispersion were added to the dispersion, to achieve the composition ratio shown in Table 2, and the mixture was stirred at 30° C., to prepare an adhesive solution. The adhesive solution was used to obtain a pure copper sheet with an adhesive layer as described in Example 1. The properties are shown in Table 3.

Comparative Example 2

Aluminum hydroxide (H-42I produced by Showa Denko K.K.) was mixed with toluene, and the mixture was treated by a sand mill, to prepare an aluminum hydroxide dispersion. A phenol novolak resin (PSM4261 produced by Gun-ei Chemical Industry Co., Ltd.), hexamethylenetetramine and methyl ethyl ketone equal in weight to the dispersion were added to the dispersion, to achieve the composition ratio shown in Table 2, and the mixture was stirred at 30° C., to prepare an adhesive solution. The adhesive solution was used, to obtain a pure copper sheet with an adhesive layer as described in Example 1. The properties are shown in Table 3.

From the examples of the present invention and the comparative examples shown in Tables 1 and 2, it can be seen that the adhesive compositions for semiconductor devices obtained according to the present invention are excellent in processability, adhesive strength, insulation reliability and durability.

EXAMPLE 7

Figure 10:
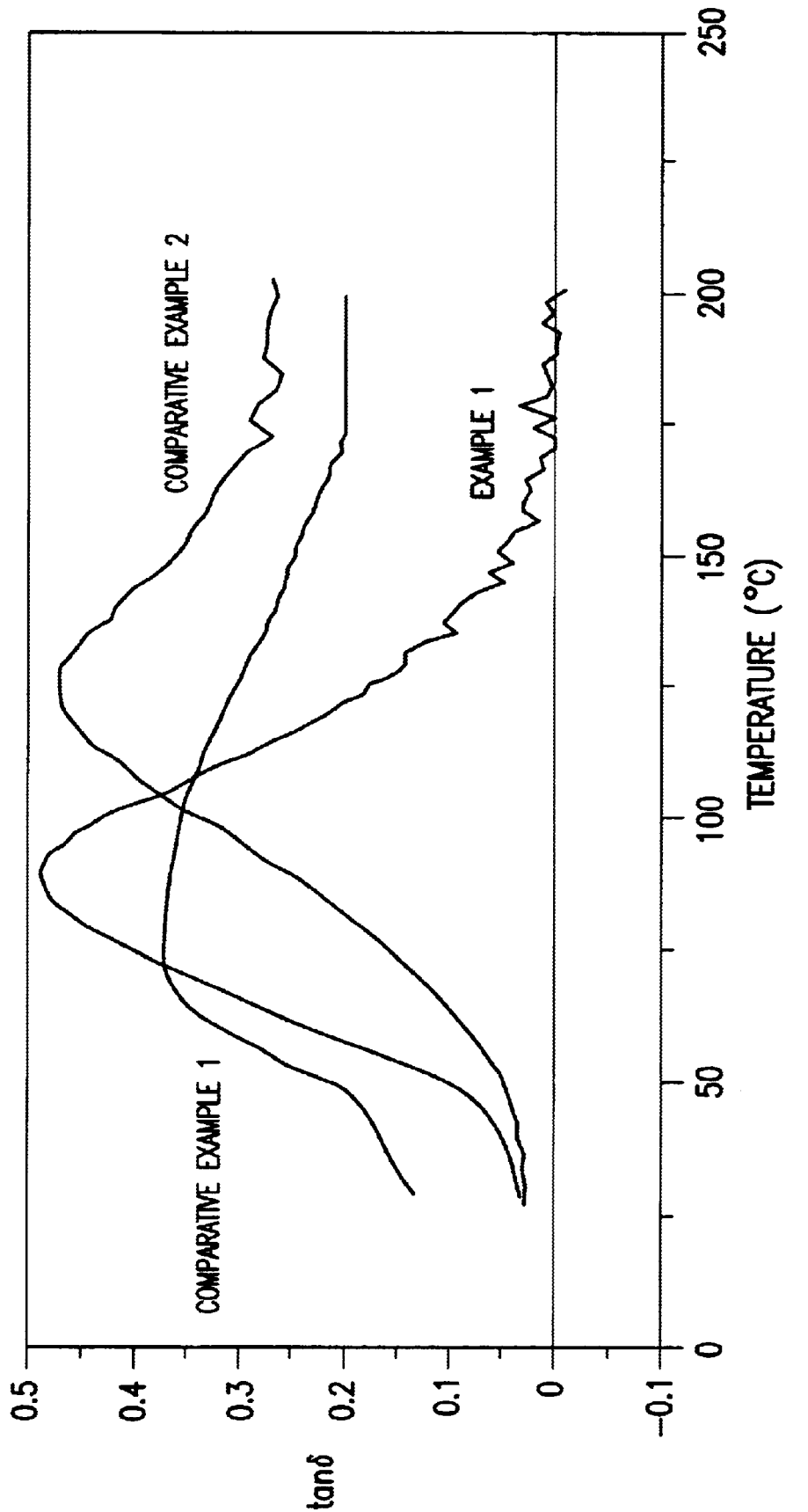
FIG. 10 is a diagram showing the measured results of tan δ of the adhesive layer of the adhesive-backed tape for TAB of the present invention.
Figure 11:
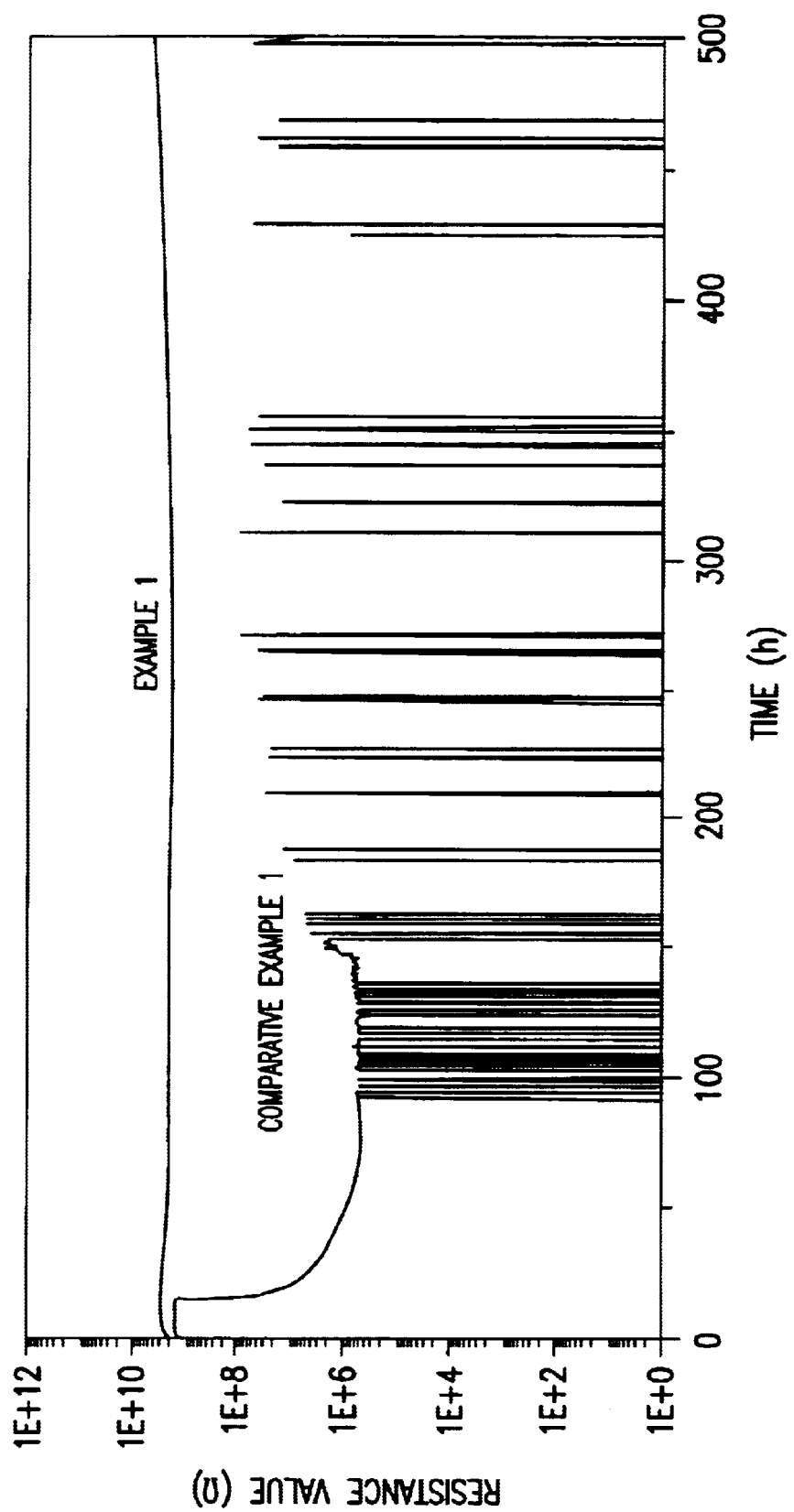
FIG. 11 is a diagram showing the measured results of insulation durability of the adhesive-backed tape for TAB of the present invention.

The polyamide resin (2.5 in amine value) obtained in Reference Example 1, epoxy resin ("Epiclon" HP4032 produced by Dainippon Ink & Chemicals, Inc., 150 in epoxy equivalent), nonylphenol type resol phenol resin (CRM0803 produced by Showa High polymer Co., Ltd.), straight type phenol resol resin (PR50087 produced by Sumitomo Durez Co., Ltd.), p-t-Bu/bisphenol A mixed type (p-t-Bu/bisphenol A=8/2) phenol resol resin (CKM935 produced by Showa High polymer Co., Ltd.) and DBU were mixed to achieve the composition ratio shown in Table 2, and the mixture was stirred in a mixed solvent of methanol and monochlorobenzene at 30° C., to achieve a concentration of 20 wt %, for preparing an adhesive solution. The adhesive was applied by a bar coater, to a 25μ thick polyethylene terephthalate film ("Lumirror" produced by Toray Industries, Inc.) used as a protective film, to achieve a dry thickness of about 12μ, and the laminate was dried at 100° C. for 1 minute and at 160° C. for 5 minutes, to prepare an adhesive sheet. The obtained adhesive sheet was laminated onto a 75μ thick polyimide film ("Upilex" 75S produced by Ube Industries, Ltd.) used as an organic insulating film at 120° C. and 1 kg/cm², to prepare an adhesive-backed tape for TAB. The properties are shown in Table 4. FIG. 10 shows the measured results of temperature dependence of tan δ. FIG. 11 shows the measured results of insulation resistance with DC 100 V applied at 130° C. and 85% RH.

According to the method described in the evaluation method (11), a conductor circuit for IC connection was formed, to obtain a semiconductor connecting substrate (pattern tape) shown in FIG. 3.

The pattern tape was used to connect an IC by inner lead bonding at 450° C. for 1 minute. Then, an epoxy based liquid sealant ("Chip Coat" 1320-617 produced by Hokuriku Toryo K.K.) was used for resin sealing, to obtain a semiconductor device. FIG. 1 is a sectional view showing the obtained semiconductor device.

EXAMPLES 8 to 11, and Comparative Examples 3 to 6

Tapes respectively with an adhesive for connecting a semiconductor were obtained by using the adhesives prepared by using the raw materials and composition ratios shown in Table 4 as described in Example 7. The properties are also shown in Table 4. The measured results of tan δ of Comparative Examples 1 and 2 are shown in FIG. 10.

From the Examples of the present invention and Comparative Examples shown in Table 4, it can be seen that the tapes respectively with an adhesive for TAB obtained according to the present invention are excellent in adhesive strength, dimensional accuracy and insulation reliability.

EXAMPLE 12

Figure 12:
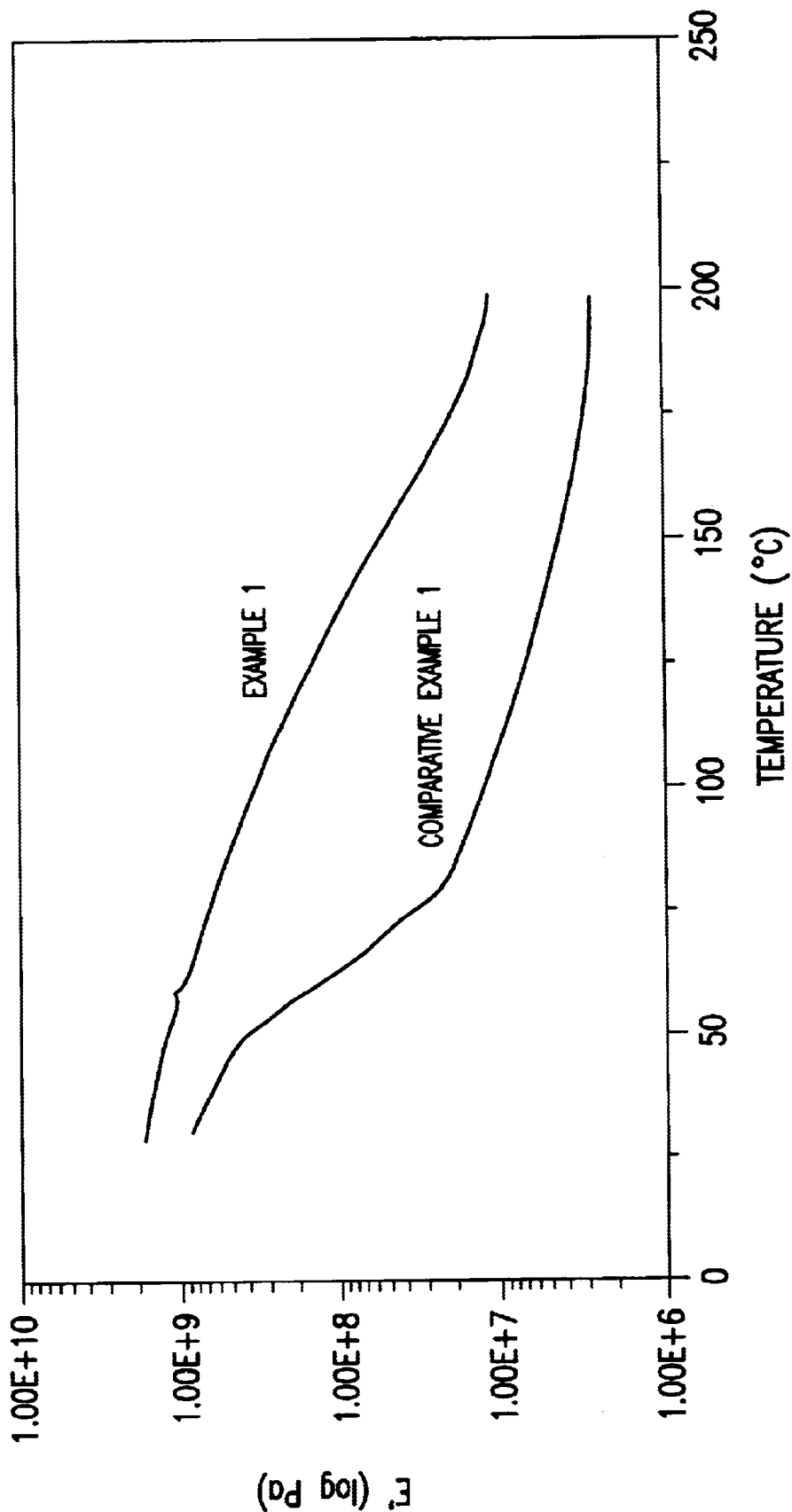
FIG. 12 is a diagram showing the measured results of storage elastic modulus E' of the adhesive layer of the adhesive-backed tape for WB of the present invention.
Figure 13:
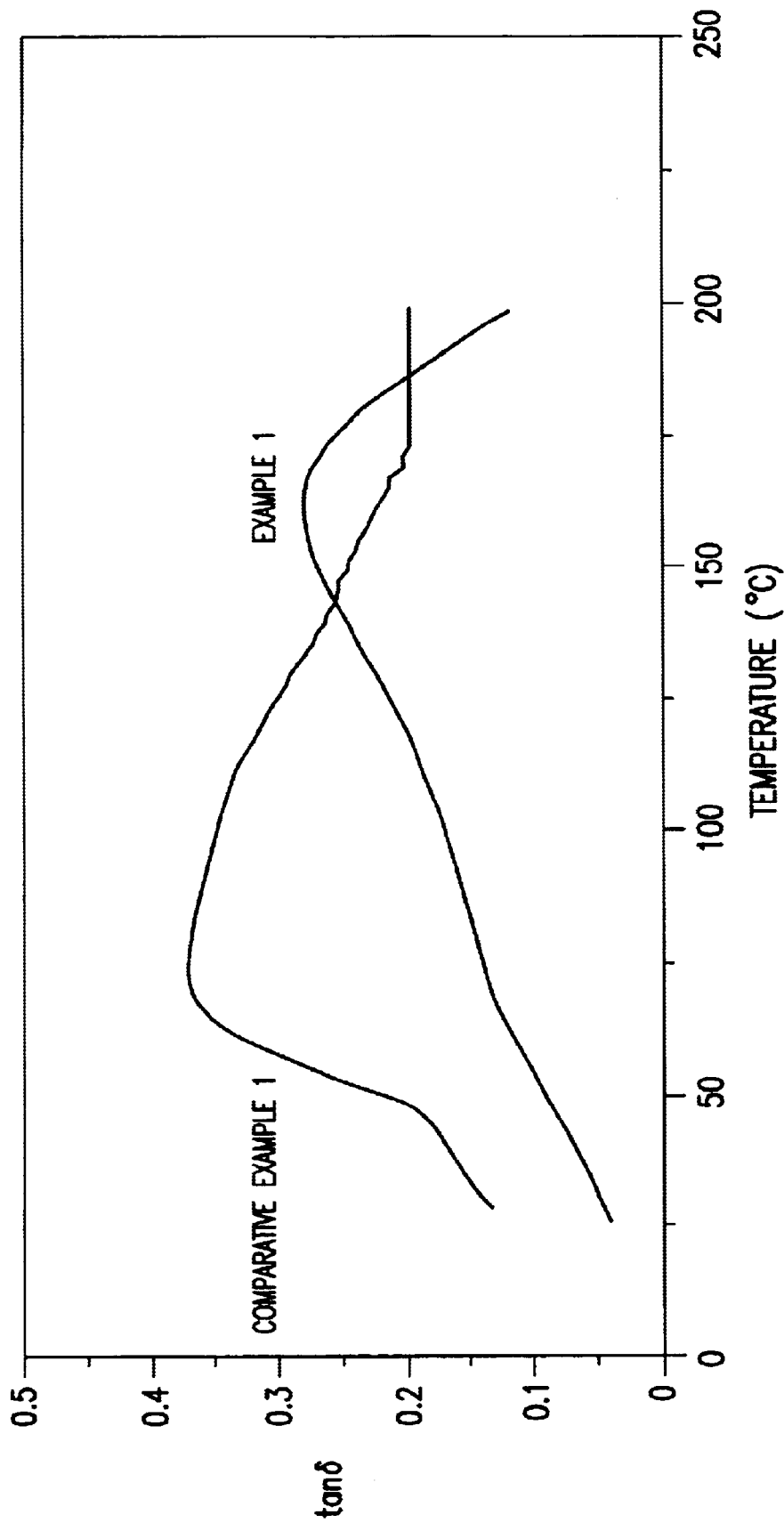
FIG. 13 is a diagram showing the measured results of tan δ of the adhesive layer of the adhesive-backed tape for WB of the present invention.

The polyamide resin (2.5 in amine value) obtained in Reference Example 1, epoxy resin (ZX1257 produced by Toto Kasei K.K., 260 in epoxy equivalent), p-t-Bu phenol type resol phenol resin (CKM1634G produced by Showa High polymer Co., Ltd.), p-t-Bu/bisphenol A mixed type (p-t-Bu/bisphenol A=8.2) phenol resol resin (CKM908 produced by Showa High polymer Co., Ltd.) and DBU were mixed, to achieve the composition ratio shown in Table 5, and the mixture was stirred in a mixed solvent of methanol and monochlorobenzene at 30° C., to achieve a concentration of 20 wt %, for preparing an adhesive solution. The adhesive was applied by a bar coater, onto a 25μ thick polyethylene terephthalate film ("Lumirror" produced by Toray Industries, Inc.) used as a protective film, and dried at 100° C. for 1 minute and at 160° C. for 5 minutes, to obtain an adhesive sheet. Furthermore, the obtained adhesive sheet was laminated on a 75μ thick polyimide film ("Upilex" 75S produced by Ube Industries, Ltd.) used as an organic insulating film at 120° C. and 1 kg/cm², to prepare an adhesive-backed tape for WB. The properties are shown in Table 5. FIG. 12 shows the measured results of the dependence of storage elastic modulus E' upon temperature, and FIG. 13 shows the measured results of the dependence of tan δ upon temperature.

As described in evaluation method (11), a conductor circuit for IC connection was formed, to obtain a semiconductor connecting substrate (pattern tape) shown in FIG. 5. In FIG. 5, symbol 31 denotes an adhesive layer of a tape for WB; 32, an organic insulating film; 33, a sprocket hole; 34, a conductor pattern; 35, a conductor at a solder ball joint; and 36, a conductor pad for WB.

Figure 6:
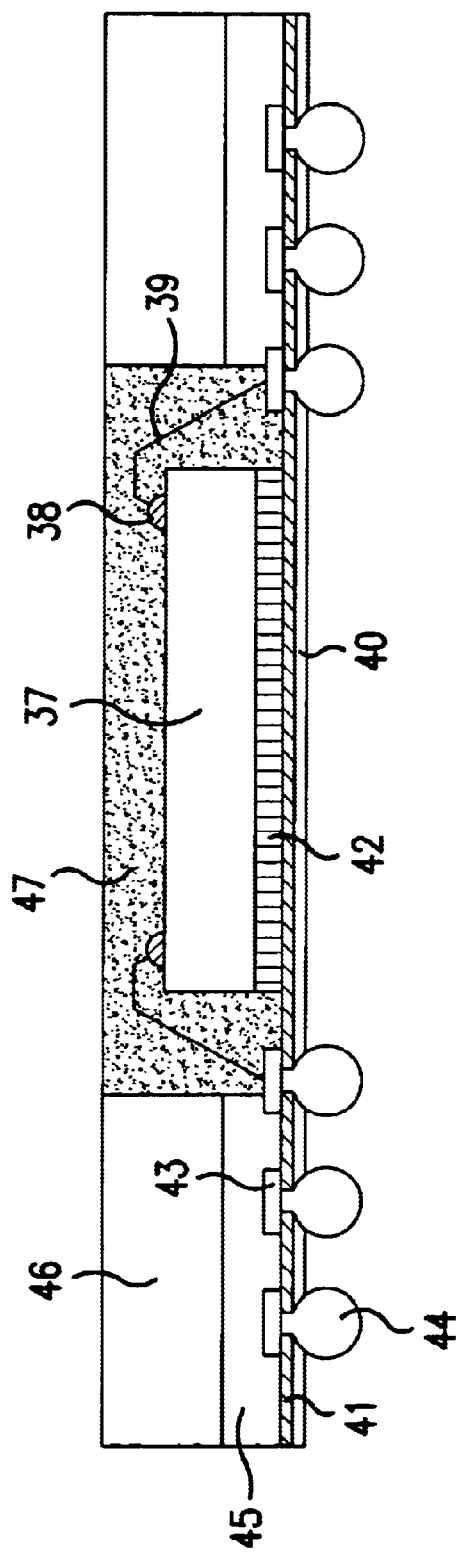
FIG. 6 is a sectional view showing a semiconductor device (BGA of WB method) using the adhesive sheet for a semiconductor connecting substrate of the present invention, as an embodiment.

The pattern tape was used for connecting an IC by inner lead bonding at 450° C. for 1 minute. Then, an epoxy based liquid sealant ("Chip Coat" 1320-617 produced by Hokuriku Toryo K.K.) was used for resin sealing, to obtain a semiconductor device. FIG. 6 is a sectional view showing the obtained semiconductor device. In FIG. 6, symbol 37 denotes an IC chip; 38, an IC electrode; 39, a gold wire; 40, an organic insulating film: 41, an adhesive layer of a tape for WB; 42, a die bonded adhesive layer; 43, a conductor at a solder ball joint; 44, a solder ball; 45, an adhesive layer of the semiconductor connecting substrate; 46, a layer without any conductor pattern formed (reinforcing sheet); and 47, a sealing resin.

EXAMPLES 13 to 15, and Comparative Examples 7 and 8

Tapes respectively with an adhesive for connecting a semiconductor were obtained using the adhesives prepared using the raw materials shown in Table 1 at the composition ratios shown in Table 5 as described in Example 12. The properties are also shown in Table 5. The measured results of tan δ of Comparative Example 1 are shown in FIG. 13.

From the examples of the present invention and Comparative Examples shown in Table 5, it can be seen that the tapes respectively with an adhesive for connecting a semiconductor obtained according to the present invention are excellent in adhesive strength and insulation reliability.

Industrial Applicability

The present invention industrially provides an adhesive sheet suitable for the adhesive layer of a semiconductor connecting substrate used to mount a semiconductor integrated circuit, an adhesive-backed tape used for tape automated bonding (TAB) (hereinafter called a tape for TAB), an adhesive-backed tape used for wire bonding (hereinafter called a tape for WB), and a semiconductor connecting substrate and a semiconductor device using the foregoing The present invention can improve the reliability of a semiconductor device for high density packaging.

TABLE 1

| Raw material | Product name | Structure | Epoxy equivalent weight | Haze[*1)] | Maker |
|---|---|---|---|---|---|
| Epoxy resin | Ep834 | Bisphenol A diglycidyl ether | 250 | 55 | Yuka Shell Epoxy |
| | Ep5050 | Tetrabromobisphenol A diglycidyl ether | 390 | 65 | Yuka Shell Epoxy |
| | HP7200 | Dicyclopentadiene diphenol diglycidyl ether | 260 | 43 | Danippon Ink & Chemicals |
| | ZX1257 | Dicyclopentadiene dixylenol diglycidyl ether | 260 | 12 | Toto Kasei |
| | YL6241 | Terpene diphenol diglycidyl ether | 250 | 31 | Yuka Shell Epoxy |

TABLE 1-continued

| Raw material | Product name | Structure | Epoxy equivalent weight | Haze*[1] | Maker |
|---|---|---|---|---|---|
| | YX4000H | Tetramethyl biphenyl diglycidyl ether | 190 | 12 | Yuka Shell Epoxy |
| | HP4032 | 2,6-dihydroxynaphthalene diglycidyl ether | 150 | 85 | Danippon Ink & Chemicals |
| Phenol resin | PSM4261 | Phenol novolak | — | — | Gun-ei Chemical |
| | PR5008*[2] | Phenol resol | — | — | Sumitomo Durez |
| | CKM935 | p-t-Bu phenol/bisphenol A copolycondensed resol | — | — | Showa Highpolymer |
| | CKS380A*[3] | Bisphenol A resol | — | — | Showa Highpolymer |
| | CKM908 | p-t-Bu phenol/bisphenol A copolycondensed resol | — | — | Showa Highpolymer |
| | CKM1634G | p-t-Bu phenol resol | — | — | Showa Highpolymer |
| | CRM0803 | Nonylphenol resol | — | — | Showa Highpolymer |
| | S895 soluble content | Soluble content of high molecular resol phenol | — | — | Kanebo |
| Curing agent | DDS | 4,4'-diaminodiphenylsulfone | — | — | Wako Pure Chem. |
| | HEXA | Hexamethylenetetramine | — | — | Wako Pure Chem. |
| Curing accelerator | DBU | Diazobicycloundecene | — | — | Sanapro |
| | TPP | Triphenylphosphine | — | — | Wako Pure Chem. |
| Inorganic grains | H421 | Aluminum hydroxide | — | — | Showa Denko |
| | Ecserica | Spherical silica | — | — | Tokuyama |

*[1] The haze is a value in reference with that of the polyamide resin of Reference Example 1. The measuring method conforms to the evaluation method (17).
*[2] Liquid. The amount in the example is as solid.
*[3] Liquid. The amount in the example is as solid.
*[4] Soluble content obtained according to the method of Reference Example 2.

TABLE 2

| Composition | Example 1 | Example 2 | Example 3 | Example 4 | Example 5 | Example 6 | Comparative example 1 | Comparative example 2 |
|---|---|---|---|---|---|---|---|---|
| Thermoplastic resin | NBR-C = 100 | NBR-C = 100 SEBS-C = 10 | NBR-C = 100 | NBR-C = 100 | NBR-C = 100 | PA = 100 (Reference Example 1) | NBR-C = 100 | — |
| Epoxy resin | Ep834 = 100 Ep5050 = 50 | HP4032 = 150 | YX4000H = 100 | HP7200 = 100 Ep828 = 50 | YL6241 = 100 Ep828 = 50 | YX4000H = 45 | — | — |
| Phenol resin | — | — | PSM4261 = 50 | — | — | PR50087 = 20 | — | PSM4261 = 100 |
| Curing agent | DDS = 6 | DDS = 6 | DDS = 3 TPP = 0.5 | DDS = 6 | DDS = 6 | DDS = 6 DBU = 1.5 | — | HEXA = 10 |
| Inorganic fine grains | H421 = 30 | Ecserica = 20 | H421 = 30 | H421 = 30 | H421 = 30 | Ecserica = 20 | H421 = 30 | H421 = 30 |

TABLE 3

| Evaluation item | Example 1 | Example 2 | Example 3 | Example 4 | Example 5 | Example 6 | Comparative example 1 | Comparative example 2 |
|---|---|---|---|---|---|---|---|---|
| Pattern embeddability | Good | Good | Good | Good | Good | Good | Good | No good |
| Cure foaming | Did not occur | Did not occur | Did not occur | Did not occur | Did not occur | Did not occur | Did not occur | Occured |
| Peeling strength/$10^3$ Nm$^{-1}$ | 1.74 | 1.53 | 1.43 | 1.35 | .44 | 1.88 | 2.51 | 0.33 |
| Insulation reliability/MΩ | | | | | | | | |
| 0 hour | 100 | 130 | 210 | 181 | 220 | 859 | 2 | 5000 |
| 200 hours | 93 | 120 | 90 | 175 | 207 | 848 | Short-circuited | 2000 |

TABLE 3-continued

|  | Example | | | | | | Comparative example | |
|---|---|---|---|---|---|---|---|---|
| Evaluation item | 1 | 2 | 3 | 4 | 5 | 6 | 1 | 2 |
| Solder heat resistance/° C. | 260 | 260 | 240 | 260 | 260 | 230 | Less than 210 | 270 |
| Heat cycle test | No peeling | No peeling | No peeling | No peeling | No peeling | No peeling | Peeling occurred | Peeling occurred |
| Storage elastic modulus/MPa | −4000 | −4000 | 10−5000 | 5−4000 | 5−4000 | 2−2000 | Less than 0.01−220 | 2000−10000 |
| Coefficient of linear expansion/$10^{-5}$ °C.$^{-1}$ | 4−19 | 1−20 | 1−18 | 4−20 | 3−20 | 10−25 | 60− Unmeasurable | 6−10 |
| Breaking energy/$10^5$ Nm$^{-1}$ | 38.7 | 45.3 | 31.4 | 41.5 | 35.2 | 13.4 | 4.6 | 1.2 |

TABLE 4

|  | Example | | | | |
|---|---|---|---|---|---|
| Item | 7 | 8 | 9 | 10 | 11 |
| Thermoplastic resin | PA = 100 | PA = 100 | PA = 100 | PA = 100 | PA = 100 |
| Phenol resin 1 | CRM0803 = 35 | CRM0803 = 50 | CRM0803 = 50 | CRM0803 = 70 | CRM0803 = 70 |
| Phenol resin 2 | PR50087 = 30 | PR50087 = 50 | PR50087 = 50 | S895 soluble content = 45 | S895 soluble content = 45 |
| Phenol resin 3 | CKM935 = 35 | — | CKS380A = 37 | — | — |
| Epoxy resin | HP4032 = 22 | HP4032 = 22 | YX4000H = 13 | HP7200 = 15 | YL6241 = 15 |
| Curing accelerator | DBU = 0.5 | DBU = 0.5 | DBU = 0.5 | DBU = 0.5 | DBU = 0.5 |
| Softening temperature/° C. | 86 | 80 | 87 | 90 | 85 |
| Breaking energy/$10^5$ Nm$^{-1}$ | 8.8 | 12.2 | 9.0 | 11.1 | 9.7 |
| Adhesive strength/$10^3$ Nm$^{-1}$ | 1.15 | 1.26 | 1.01 | 1.06 | 1.15 |
| High temperature high humidity insulatability |  |  |  |  |  |
| Initial resistance value/Ω | $2 \times 10^9$ | $1 \times 10^9$ | $2 \times 10^9$ | $3 \times 10^9$ | $2 \times 10^9$ |
| Insulation dropping time/h | 500 or more | 500 or more | 500 or more | 500 or more | 500 or more |
| High temperature insulatability |  |  |  |  |  |
| Initial resistance value/Ω | $1 \times 10^{10}$ | $7 \times 10^9$ | $1 \times 10^{10}$ | $1 \times 10^{10}$ | $1 \times 10^{10}$ |
| Insulation dropping time/h | 500 or more | 500 or more | 500 or more | 500 or more | 500 or more |
| Warping after curing/mm | 0.11 | 0.15 | 0.21 | 0.18 | 0.20 |

|  | Comparative example | | | |
|---|---|---|---|---|
| Item | 3 | 4 | 5 | 6 |
| Thermoplastic resin | PA = 100 | PA = 100 | PA = 100 | PA = 100 |
| Phenol resin 1 | CRM0803 = 29 | CRM0803 = 30 | CKM1634G = 3 | CRM0803 = 100 |
| Phenol resin 2 | PR50087 = 10 | CKM1634G = 8 | PR50087 = 30 | — |
| Phenol resin 3 | CKM935 = 20 | CKS380A = 80 | CKM935 = 35 | — |
| Epoxy resin | HP4032 = 70 | HP4032 = 10 | HP4032 = 22 | HP4032 = 22 |
| Curing accelerator | DBU = 0.5 | DBU = 0.5 | DBU = 0.5 | DBU = 0.5 |
| Softening temperature/° C. | 52 | 123 | 89 | 78 |
| Breaking energy/$10^5$ Nm$^{-1}$ | 4.6 | 10.1 | 10.3 | 6.3 |
| Adhesive strength/$10^3$ Nm$^{-1}$ | 1.28 | 0.42 | 0.57 | 0.88 |
| High temperature high humidity insulatability |  |  |  |  |
| Initial resistance value/Ω | $9 \times 10^8$ | $3 \times 10^9$ | $2 \times 10^9$ | $8 \times 10^8$ |
| Insulation dropping time/h | 20 | 500 or more | 500 or more | 40 |
| High temperature insulatability |  |  |  |  |
| Initial resistance value/Ω | $3 \times 10^9$ | $1 \times 10^{10}$ | $8 \times 10^9$ | $5 \times 10^9$ |
| Insulation dropping time/h | 5 | 500 or more | 420 | 140 |
| Warping after curing/mm | 0.13 | 1.12 | 0.67 | 0.11 |

TABLE 5

| Item | Example | | | | Comparative Example | |
|---|---|---|---|---|---|---|
| | 12 | 13 | 14 | 15 | 7 | 8 |
| Thermoplastic resin | PA = 100 | PA = 100 | PA = 100 | PA = 100 | PA = 100 | PA = 100 |
| Phenol resin 1 | CKM1636G = 50 | CKM1636G = 50 | CKM1636G = 50 | CKM1636G = 75 | CRM0803 = 20 | CKS380A = 150 |
| Phenol resin 2 | CKM908 = 50 | CKS380A = 50 | S895 soluble | S895 soluble | PR50087 = 10 | PR50087 = 150 |
| Phenol resin 3 | — | — | — | — | CKM935 = 20 | — |
| Epoxy resin | ZX1257 = 50 | ZX1257 = 50 | ZX6241 = 50 | YX400H = 30 | HP4032 = 70 | HP7200 = 150 |
| Curing accelerator | DBU = 0.5 | DBU = 0.5 | DBU = 0.5 | DBU = 0.5 | DBU = 0.5 | DBU = 0.5 |
| Softening temperature/° C. | 160 | 186 | 148 | 152 | 52 | 210 |
| 150° C. storage elastic modulus/MPa | 50.4 | 58.5 | 68.7 | 70.1 | 4.2 | 82.4 |
| Adhesive strength/$10^5$ Nm$^{-1}$ | 1.03 | 1.14 | 0.98 | 1.11 | 1.28 | 0.42 |
| WB strength/N | 1.08 | 0.95 | 1.01 | 0.85 | WB not | 0.51 |
| High temperature high humidity insulatability | | | | | | |
| Initial resistance value/Ω | $2 \times 10^9$ | $1 \times 10^9$ | $2 \times 10^9$ | $2 \times 10^9$ | $9 \times 10^8$ | $3 \times 10^9$ |
| Insulation dropping time/h | 500 or more | 500 or more | 500 or more | 500 or more | 20 | 500 or more |
| High temperature insulatability | | | | | | |
| Initial resistance value/Ω | $1 \times 10^{10}$ | $7 \times 10^9$ | $1 \times 10^{10}$ | $1 \times 10^{10}$ | $3 \times 10^9$ | $1 \times 10^{100}$ |
| Insulation dropping time/h | 500 or more | 500 or more | 500 or more | 500 or more | 5 | 500 or more |

What is claimed is:

1. An adhesive sheet for a semiconductor connecting flexible substrate comprising a laminate having an adhesive layer on a flexible substrate, wherein said adhesive layer contains a thermoplastic resin (A) and an epoxy resin containing glycidyl groups (B), and said epoxy resin (B) contains at least one epoxy resin (B) selected from the following (I), (II), and (III) as an essential component:

(I) dicyclopentadiene skeleton-containing epoxy resins, (II) terpene skeleton-containing epoxy resins, and (III) biphenyl skeleton-containing epoxy resins,
wherein the flexible substrate comprises a flexible insulating film made of a polyimide, polyester, polyphenylene sulfide, polyether ether ketone, aramid, polycarbonate or polyarylate.

2. An adhesive sheet for a semiconductor connecting substrate according to claim 1, wherein the dicyclopentadiene skeleton-containing epoxy resins (b1) are represented by the following general formula (I):

(I)

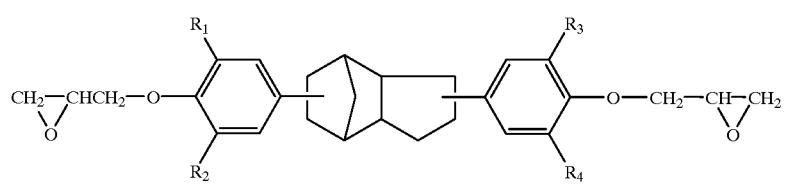

wherein $R_1$ to $R_4$ stand for a hydrogen atom, lower alkyl group with 1 to 4 carbon atoms or halogen atom.

3. An adhesive sheet as claimed in claim 1 for a semiconductor connecting substrate which forms an adhesive layer (E) of a semiconductor integrated circuit board having at least, respectively, one wiring board layer (C) having an insulator layer and a conductor pattern, one layer without any conductor pattern formed (D) and one adhesive layer (E), wherein said adhesive sheet has a storage elastic modulus of 0.1 to 10000 MPa and a coefficient of linear expansion of $0.1 \times 10^{-5} \sim 50 \times 10^{-5}$°C.$^{-1}$ in a temperature range of −50 to 150° C. after having been cured by heating.

4. An adhesive sheet for a semiconductor connecting substrate according to claim 3, which has a breaking energy at 25°0 C. of $5 \times 10^5$ Nm$^{-1}$ or more after having been cured by heating.

5. An adhesive sheet for a semiconductor connecting substrate having at least, respectively, one wiring board layer (C) being constituted by an insulator layer and a conductor pattern, one layer without any conductor pattern formed (D) and one adhesive layer (E), which forms an adhesive layer (E) of a semiconductor integrated circuit board, wherein said adhesive sheet contains at least, respectively, one thermoplastic resin (A) and one epoxy resin containing glycidyl groups (B) as essential components, and said epoxy resin (B) contains at least one epoxy resin (B) selected from the following (I), (II), and (III) as an essential component:

(I) dicyclopentadiene skeleton-containing epoxy resins, (II) terpene skeleton-containing epoxy resins, and (III) biphenyl skeleton-containing epoxy resins.

6. An adhesive sheet for a semiconductor connecting substrate according to claim 5, wherein the thermoplastic resin (A) is a copolymer (a1) containing butadiene as an essential comonomer.

7. An adhesive sheet for a semiconductor connecting substrate according to claim 5, wherein the thermoplastic resin (A) contains a copolymer (a2) having butadiene as an essential comonomer and having carboxyl groups.

8. An adhesive sheet for a semiconductor connecting substrate according to claim 5, wherein the thermoplastic resin (A) is a polyamide resin (a3) containing a dicarboxylic acid with 36 carbon atoms as an essential component.

9. An adhesive sheet for a semiconductor connecting substrate according to claim 5, wherein the thermoplastic resin (A) is a polyamide resin (a3) containing a dicarboxylic acid with 36 carbon atoms as an essential component and is a polyamide resin (a4) having an amine value of more than 1 and less than 3.

10. An adhesive sheet for a semiconductor connecting substrate according to claim 5, which additionally contains a phenol resin (F).

11. A semiconductor connecting substrate comprising the adhesive sheet for a semiconductor connecting substrate stated in claim 5, wherein said semiconductor connecting substrate has at least, respectively, one wiring board layer being constituted by an insulator layer and a conductor pattern (C), one layer without any conductor pattern formed (D) and one adhesive layer (E).

12. A semiconductor device comprising the semiconductor connecting substrate of claim 11 and an integrated circuit.

13. The adhesive sheet for tape automated bonding (TAB) being constituted by a laminate as claimed in claim 1, said laminate having an adhesive layer and a protective film layer on a flexible organic insulating film, wherein said adhesive layer has a softening temperature of 60 to 110°0 C. after having been cured, and has an insulation resistance dropping time of 50 hours or more after having been allowed to stand in an environment of 130° C. and 85% RH with DC 100 V applied.

14. The adhesive sheet for TAB according to claim 13, wherein the adhesive layer has a breaking energy of 5×10$^5$ Nm$^{-1}$ or more at 25% after having been cured by heating.

15. An adhesive-backed tape for tape automated bonding (TAB) being constituted by a laminate having an adhesive layer and a protective film layer on a substrate, wherein said adhesive layer contains a thermoplastic resin (A) and an epoxy resin containing glycidyl groups (B) and said epoxy resin (B) contains at least one epoxy resin (B) selected from the following (I), (II), and (III) as an essential component:

(I) dicyclopentadiene skeleton-containing epoxy resins, (II) terpene skeleton-containing epoxy resins, and (III) biphenyl skeleton-containing epoxy resins, wherein the flexible substrate comprises a flexible insulating film made of a polyimide, polyester, polyphenylene, sulfide, polyether sulfane, polyether ether ketone, aramid, polycarbonate or polyarylate.

16. An adhesive-backed tape for TAB according to claim 15, wherein the thermoplastic resin (A) is a polyamide resin (a) containing a dicarboxylic acid with 36 carbon atoms as an essential component.

17. An adhesive-backed tape for TAB according to claim 15, wherein the thermoplastic resin (A) is a polyamide resin (a) containing a dicarboxylic acid with 36 carbon atoms as an essential component and is a polyamide resin (a') having an amine value of 1 or more and 3 or less.

18. An adhesive-backed tape for TAB according to claim 15, wherein the adhesive layer additionally contains a phenol resin (F).

19. An adhesive-backed tape for TAB according to claim 18, wherein the phenol resin (F) contains more than 35 wt % and less than 60 wt % of a resol phenol resin based on the weight of the adhesive layer.

20. An adhesive-backed tape for TAB according to claim 19, wherein the resol phenol resin contains a bifunctional phenol derivative (f1) with at least one alkyl group with 5 to 12 carbon atoms and a trifunctional or higher-functional phenol derivative (f2) as essential components, with the condition that f1/(f1+f2)=0.2~0.8.

21. The adhesive sheet for TAB according to claim 13, wherein the organic insulating film is a polyimide film.

22. A semiconductor device comprising the adhesive-backed tape for TAB of claim 13 and an integrated circuit.

23. The adhesive sheet for wire bonding connection being constituted by a laminate as claimed in claim 1, said laminate having an adhesive and a protective film layer on a flexible organic insulating film, wherein said adhesive layer has a softening temperature of 120 to 200° C. after having been cured, a storage elastic modulus of 20 to 100 MPa at 150° C. and an insulation resistance dropping time of 50 hours or more after having been allowed to stand in an environment of 130° C. and 85% RH with DC 100 V applied.

24. The adhesive sheet for wire bonding connection according to claim 23, wherein the adhesive layer contains a thermoplastic resin (A) and an epoxy resin (B), and the film made of 1/1 mixture consisting of said thermoplastic resin (A) and said epoxy resin (B) is 8 to 40 in haze.

25. The adhesive sheet for wire bonding connection according to claim 23, wherein the epoxy resin content is 10 wt % to 40 wt % based on the weight of the adhesive layer.

26. The adhesive sheet for wire bonding connection according to claim 23, wherein the thermoplastic resin (A) is a polyamide resin (a) containing a dicarboxylic acid with 36 carbon atoms as an essential component.

27. The adhesive sheet for wire bonding connection according to claim 23, wherein the thermoplastic resin (A) consists of a polyamide resin (a) containing a dicarboxylic acid with 36 carbon atoms as an essential component an a polyamide resin (a') having an amide value of 1 or more and 3 or less.

28. The adhesive sheet for wire bonding connection according to claim 23, wherein the adhesive layer contains additionally a phenol resin (F).

29. The adhesive sheet for wire bonding connection according to claim 28, wherein the phenol resin (F) contains a resol type phenol resin of more than 35 wt % and less than 60 wt % based on the weight of the adhesive layer.

30. The adhesive sheet for wire bonding connection according to claim 23, wherein the organic insulating film is a polyimide film.

31. A semiconductor device comprising the adhesive-backed tape for wire bonding of claim 23 and an integrated circuit.

32. A semiconductor device comprising the adhesive sheet of claim 1 and an integrated circuit.

33. An adhesive sheet for a semiconductor connecting substrate according to claim 1, wherein the terpene skeleton-containing epoxy resins (b2) are represented by the following general formula (II):

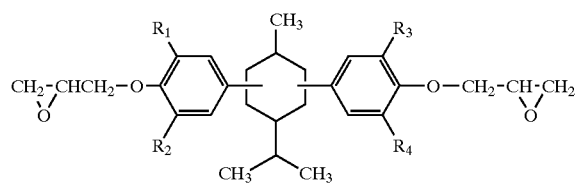 (II)

wherein $R_1$ to $R_4$ stand for a hydrogen atom, lower alkyl group with 1 to 4 carbon atoms, or halogen atom.

34. An adhesive sheet for a semiconductor connecting substrate according to claim 1, wherein the biphenyl skeleton-containing epoxy resins (b3) are represented by the following general formula (III):

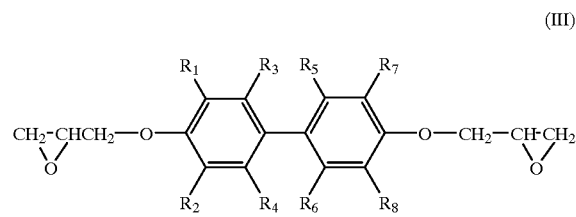 (III)

wherein $R_1$ to $R_8$ stand for, respectively independently, a hydrogen atom, lower alkyl group with 1 to 4 carbon atoms or halogen atom.

* * * * *